(12) United States Patent
Mei

(10) Patent No.: US 12,391,874 B2
(45) Date of Patent: Aug. 19, 2025

(54) LIGHT-EMITTING DEVICE AND PREPARATION METHOD THEREOF, DISPLAY SUBSTRATE AND DISPLAY DEVICE

(71) Applicants: Beijing BOE Technology Development Co., Ltd., Beijing (CN); BOE TECHNOLOGY GROUP CO., LTD., Beijing (CN)

(72) Inventor: Wenhai Mei, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/639,009

(22) PCT Filed: Apr. 20, 2021

(86) PCT No.: PCT/CN2021/088373
§ 371 (c)(1),
(2) Date: Feb. 28, 2022

(87) PCT Pub. No.: WO2022/222027
PCT Pub. Date: Oct. 27, 2022

(65) Prior Publication Data
US 2024/0040813 A1 Feb. 1, 2024

(51) Int. Cl.
*H10K 50/16* (2023.01)
*C09K 11/06* (2006.01)
(Continued)

(52) U.S. Cl.
CPC ............ *C09K 11/06* (2013.01); *H10K 50/115* (2023.02); *H10K 71/12* (2023.02); *H10K 50/166* (2023.02);
(Continued)

(58) Field of Classification Search
CPC ........ H10K 50/14; H10K 50/16; H10K 50/18; H10K 50/115; H10K 50/155; H10K 50/166; H10K 50/181; H10K 59/35; H10K 71/00; H10K 71/12; H10K 102/00; H10K 2102/331; C09K 11/06
(Continued)

(56) References Cited

U.S. PATENT DOCUMENTS

2020/0308017 A1* 10/2020 Cheng ..................... H01L 33/06
2020/0321547 A1* 10/2020 Wu ......................... H10K 50/80

FOREIGN PATENT DOCUMENTS

| CN | 108276986 A | 7/2018 |
| CN | 109148695 A | 1/2019 |

(Continued)

*Primary Examiner* — Chuong A Luu
(74) *Attorney, Agent, or Firm* — HOUTTEMAN LAW LLC

(57) ABSTRACT

The present disclosure provides a light-emitting device, comprising: a first carrier transport layer disposed on a substrate; and a light-emitting layer disposed on a side of the first carrier transport layer away from the substrate; wherein the first carrier transport layer comprises a first transport sublayer comprising nanoparticles and an inorganic ligand connected to the surface of the nanoparticles, wherein the inorganic ligand comprises a halogen group element or an oxygen group element.

14 Claims, 11 Drawing Sheets

(51) Int. Cl.
  *H10K 50/115* (2023.01)
  *H10K 71/12* (2023.01)
  *H10K 50/18* (2023.01)
  *H10K 71/00* (2023.01)
(52) U.S. Cl.
  CPC ........... *H10K 50/18* (2023.02); *H10K 50/181* (2023.02); *H10K 71/00* (2023.02)
(58) Field of Classification Search
  USPC .......................................................... 257/40
  See application file for complete search history.

(56) References Cited

FOREIGN PATENT DOCUMENTS

| | | |
|---|---|---|
| CN | 109994623 A | 7/2019 |
| CN | 109994624 A | 7/2019 |

\* cited by examiner

LIGHT-EMITTING DEVICE AND PREPARATION METHOD THEREOF, DISPLAY SUBSTRATE AND DISPLAY DEVICE

This is a National Phase Application filed under 35 U.S.C. 371 as a national stage of PCT/CN2021/088373, filed on Apr. 20, 2021.

TECHNICAL FIELD

The present disclosure relates to the field of display technology, and in particular, to a light-emitting device and a method for preparing the same, a display substrate and a display device.

BACKGROUND

With the in-depth development of quantum dot technology, the research on electroluminescent quantum dot light-emitting diodes (QLEDs) has been increasingly deepened, and the quantum efficiency has been continuously improved, which has basically reached the level of industrialization. The industrialization of the QLEDs utilizing a new process and technology has become a future trend.

SUMMARY

The present disclosure aims to solve at least one of the technical problems existing in the prior art, and proposes a light-emitting device and a method for manufacturing the same, a display substrate and a display device.

In order to achieve the above objects, the present disclosure provides a light-emitting device, including:
- a first carrier transport layer disposed on a substrate;
- a light-emitting layer disposed on a side of the first carrier transport layer away from the substrate;
- wherein, the first carrier transport layer comprises a first transport sublayer comprising nanoparticles and an inorganic ligand connected to a surface of the nanoparticles, and wherein the inorganic ligand comprises a halogen group element or an oxygen group element.

Optionally, the inorganic ligand has a general formula of: $B^-$ or $AB_x^{y-}$;
- wherein, B is a halogen group element, A is a metallic element, and both x and y are positive integers.

Optionally, B comprises any one of iodine, chlorine, bromine and fluorine, and A comprises any one of zinc, cadmium, mercury, copper, silver and gold.

Optionally, the inorganic ligand has a general formula of: $MJ_x^{y-}$ or $M_zJ_x^{y-}$;
- wherein, J is an oxygen group element, M is a metallic element, and x, y, and z are all positive integers.

Optionally, J comprises any one of oxygen, sulfur, selenium, and tellurium, and M comprises any one of molybdenum, chromium, tungsten, iron, ruthenium, osmium, cobalt, rhodium, aluminum, gallium, indium, germanium, tin, lead, antimony and bismuth.

Optionally, the first carrier transport layer further comprises a second transport sublayer disposed on a side of the first transport sublayer away from the light-emitting layer, wherein the second transport sublayer does not comprise the inorganic ligand.

Optionally, the light-emitting device further comprises:
- a first electrode disposed between the substrate and the first carrier transport layer;
- a second carrier transport layer disposed on a side of the light-emitting layer away from the substrate;
- a second electrode disposed on a side of the second carrier transport layer away from the substrate;
- wherein, one of the first carrier transport layer and the second carrier transport layer is an electron transport layer, and the other is a hole transport layer.

Optionally, the light-emitting device further comprises: a hole injection layer;
- wherein the hole injection layer is disposed on a side of the hole transport layer away from the light-emitting layer.

Optionally, the light-emitting layer comprises a quantum dot layer.

The present disclosure also provides a display substrate, comprising: a plurality of light-emitting devices, wherein at least one of the plurality of light-emitting devices adopts the above-mentioned light-emitting device.

Optionally, each of the plurality of light-emitting devices adopts the above-mentioned light-emitting device.

The plurality of light-emitting devices comprise a plurality of first light-emitting devices and a plurality of second light-emitting devices, and the emission color of each of the plurality of first light-emitting devices is different from that of each of the plurality of second light-emitting devices.

Optionally, when the first carrier transport layer is an electron transport layer, each of the plurality of second light-emitting devices further comprises an electron blocking layer located between the electron transport layer and the light-emitting layer of the second light-emitting device; or
when the first carrier transport layer is a hole transport layer, each of the plurality of first light-emitting devices further comprises a hole blocking layer between the hole transport layer and the light-emitting layer of the first light-emitting device.

Optionally, when the first carrier transport layer is an electron transport layer, the first carrier transport layer of each of the plurality of second light-emitting devices has a thickness greater than that of the first carrier transport layer of each of the plurality of first light-emitting devices; or
when the first carrier transport layer is a hole transport layer, the first carrier transport layer of each of the plurality of first light-emitting devices has a thickness greater than that of each of the first carrier transport layers of the plurality of second light-emitting devices.

Optionally, when the first carrier transport layer is an electron transport layer, the inorganic ligand in the first carrier transport layer of each of the plurality of second light-emitting devices has a doping concentration less than the doping concentration of the inorganic ligand in the first carrier transport layer of each of the plurality of first light-emitting devices; or
when the first carrier transport layer is a hole transport layer, the inorganic ligand in the first carrier transport layer of each of the plurality of second light-emitting devices has a doping concentration greater than the doping concentration of the inorganic ligand in the hole transport layer of each of the plurality of first light-emitting devices.

Optionally, each of the plurality of first light-emitting devices is a blue quantum dot light-emitting device, and the plurality of second light-emitting devices comprise a plurality of red quantum dot light-emitting devices and a plurality of green quantum dot light-emitting devices.

The present disclosure also provides a display device, which comprises the above-mentioned display substrate.

The present disclosure also provides a method for preparing a light-emitting device, comprising:

forming a first carrier transport layer on a substrate; and forming a light-emitting layer on a side of the first carrier transport layer away from the substrate;

wherein, the first carrier transport layer comprises a first transport sublayer comprising nanoparticles and an inorganic ligand connected to a surface of the nanoparticles, and wherein the inorganic ligand comprises a halogen group element or an oxygen group element.

Optionally, before forming the first carrier transport layer, the preparation method further comprises:

forming a first electrode on the substrate.

After forming the light-emitting layer, the preparation method may further comprises:

forming a second carrier transport layer on a side of the light-emitting layer away from the substrate; and forming a second electrode on a side of the second carrier transport layer away from the substrate;

wherein, one of the first carrier transport layer and the second carrier transport layer is an electron transport layer, and the other is a hole transport layer.

Optionally, forming the first carrier transport layer specifically comprises:

forming an initial carrier transport layer comprising the nanoparticles and an organic ligand connected to the surface of the nanoparticles; and forming a first solution layer containing the inorganic ligand on the initial carrier transport layer, such that ligand exchange occurs between the first solution layer and the initial carrier transport layer to form the first carrier transport layer including the first transport sublayer.

Optionally, before forming the light-emitting layer, the preparation method further comprises:

forming a sacrificial layer on the side of the first carrier transport layer away from the substrate; and forming an accommodating groove on the sacrificial layer;

wherein, the light-emitting layer is formed in the accommodating groove.

After forming the light-emitting layer, the preparation method may further comprises: removing the sacrificial layer.

Optionally, forming the accommodating groove on the sacrificial layer specifically comprises:

forming a photoresist layer on the sacrificial layer;

exposing and developing the photoresist layer to remove the photoresist in the region corresponding to the accommodating groove; and etching the sacrificial layer by oxygen plasma to form the accommodating groove.

BRIEF DESCRIPTION OF DRAWINGS

Accompanying drawings are provided for further understanding of this disclosure and constitute a part of the specification for the purpose of explaining the disclosure together with the following specific embodiments, but should not be considered as a limitation of the disclosure. In the drawings.

DETAIL DESCRIPTION OF EMBODIMENTS

Hereinafter, specific embodiments of the present disclosure will be described with reference to the accompanying drawings. It should be understood that the specific embodiments as set forth herein are merely for the purpose of illustration and explanation of the invention and should not be constructed as a limitation thereto.

Unless otherwise defined, the technical or scientific terms used in the embodiments of the present disclosure shall have the ordinary meaning as understood by those of ordinary skill in the art to which the present disclosure pertains. As used in this disclosure, "first", "second" and similar terms do not denote any order, quantity, or importance, but are merely used to distinguish different elements. Likewise, the phrases such as "comprising", "including" and the like mean that the elements or objects present before the phrases encompass the elements or objects and their equivalents recited after the phrases, but do not exclude the presence of other elements or objects. The phrases such as "connected", "linked" and the like are not limited to physical or mechanical connections, but may comprise electrical connections, either direct or indirect. The phases "on", "under", "left", "right", etc. are only used to indicate the relative positional relationship, and when the absolute position of the described object changes, the relative positional relationship may also change accordingly.

Figure 1A:
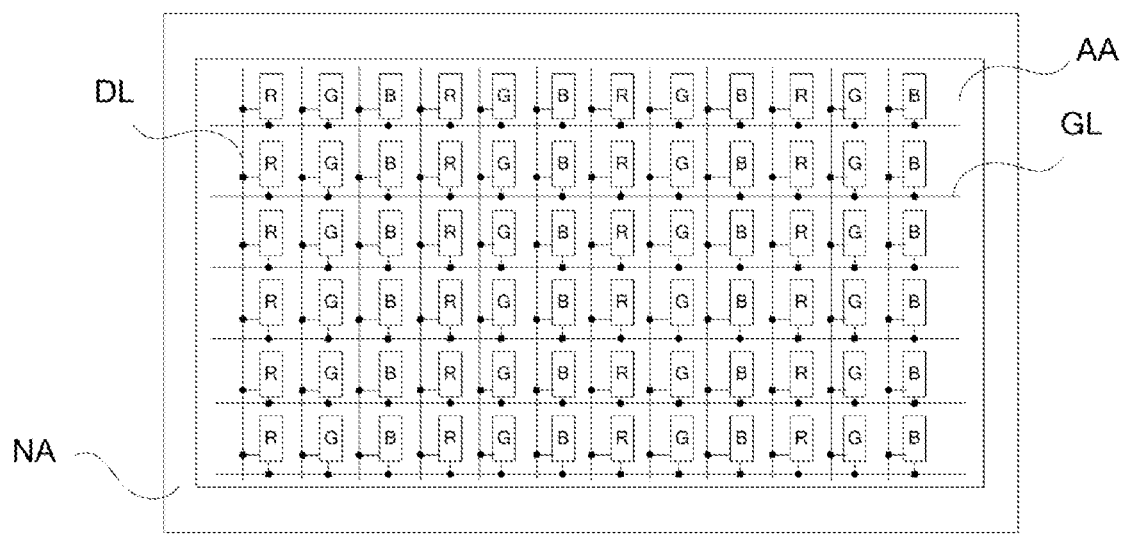
FIG. 1a is a plan view of a display substrate in an embodiment.

FIG. 1a is a plan view of a display substrate in an embodiment. As shown in FIG. 1a, the display substrate has a display area AA and a non-display area NA located outside the display area AA. A plurality of scan lines GL and a plurality of data lines DL are disposed in the display area AA. The plurality of scan lines GL and the plurality of data lines DL are disposed crosswise to define a plurality of sub-pixels. Exemplarily, every three adjacent sub-pixels in the row direction form a pixel unit, and three adjacent sub-pixels (for example, red sub-pixel R, green sub-pixel G, and blue sub-pixel B) are used to display different colors. The sub-pixels located in the same row are provided with scan signals by the same scan line GL, and the sub-pixels located in the same column are provided with data voltage signals by the same data line DL. A gate driving circuit and a driving chip (not shown) may be provided in the non-display area NA, wherein the scan line GL is connected to the gate driving circuit, and the data line DL is connected to the driving chip.

Each of the sub-pixels comprises a light-emitting device and a pixel circuit, wherein the pixel circuit is connected to the scan line GL and the data line DL. The pixel circuit is configured to provide a driving signal to the light-emitting device according to the electrical signals provided by the scan line GL and the data line DL, so that the light-emitting device effects to display. For example, the pixel circuit comprises at least a writing transistor and a driving transistor, wherein the gate of the writing transistor is connected to the scan line GL, and the writing transistor is configured to transmit the data voltage signal provided by the data line DL to the gate of the driving transistor in response to the control of the scan signal provided by the scan line GL. The driving transistor provides a driving current to the light-emitting device according to the voltage difference between the gate and the first electrode, so that the light-emitting device effects to display. It should be noted that both the writing transistor and the driving transistor may be thin film transistors, and the thin film transistor comprises a gate electrode, a first electrode and a second electrode, wherein one of the first electrode and the second electrode is a source electrode, and the other is a drain electrode.

Figure 1B:
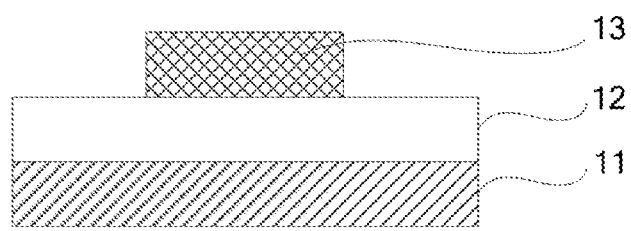
FIG. 1B is a schematic diagram of a light-emitting device in an embodiment.
Figure 1C:
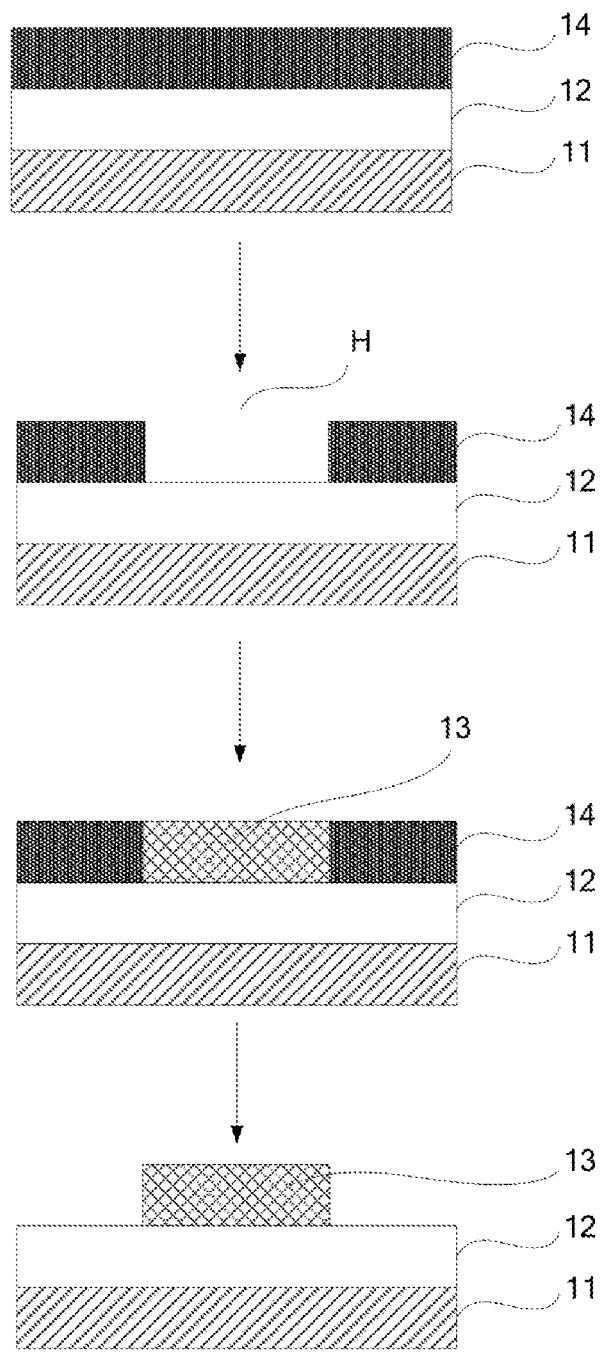
FIG. 1c is a schematic diagram of preparing a light-emitting device in an embodiment.

FIG. 1B is a schematic diagram of a light-emitting device in an embodiment. As shown in FIG. 1B, the light-emitting device comprises a substrate 11, a carrier transport layer 12 and a light-emitting layer 13 arranged in sequence along a direction away from the substrate 11. Of course, the light-emitting device may also comprise other film layers such as electrodes, which are not shown in FIG. 1B. The light-emitting layer 13 may be a quantum dot layer. FIG. 1c is a schematic diagram of preparing a light-emitting device in an embodiment. As shown in FIG. 1c, when preparing the light-emitting layer 13, the carrier transport layer 12 may be formed on the substrate 11 firstly; a sacrificial layer 14 is then formed on a side of the carrier transport layer 12 away from the substrate 11; then an accommodating groove H is formed on the sacrificial layer 14 according to a patterning process, and a light-emitting layer 13 is formed in the accommodating groove H; and finally, the sacrificial layer 14 is removed to obtain a patterned light-emitting layer 13. The carrier transport layer 12 comprises nanoparticles (for example, the carrier transport layer can be an electron transport layer, and the nanoparticles can be zinc oxide nanoparticles) and a ligand connected to the surface of the nanoparticles. For example, the carrier transport layer 12 may be an electron transport layer, and the nanoparticles may be zinc oxide nanoparticles. The ligands are generally organic ligands, such as ethanolamine, which are used to protect the nanoparticles from direct exposure of the nanoparticles.

At present, the material of the sacrificial layer 14 is usually made of organic materials. When forming the accommodating groove H, a dry etching process is usually used. Specifically, oxygen plasma is generally used for dry etching. Due to the characteristics of chemical reaction between the oxygen plasma and the organic substance, the material of the sacrificial layer 14 can react with oxygen plasma to form gas and volatilize. However, in order to be etched cleanly, the sacrificial layer 14 needs to be over-etched, so the oxygen plasma will inevitably contact the surface of the carrier transport layer 12, and the organic ligands connected to the surface of the nanoparticles will also react with the oxygen plasma to generate gas and volatilize, resulting in the absence of organic ligands on the surface of the nanoparticles (for example, when the organic ligand is ethanolamine, the organic ligand reacts with oxygen plasma to generate carbon dioxide, nitrogen dioxide and water), which will affect the performance of the carrier transport layer 12, eventually increasing the turn-on voltage of the light-emitting device and reducing the efficiency of the light-emitting device.

Figure 2A:
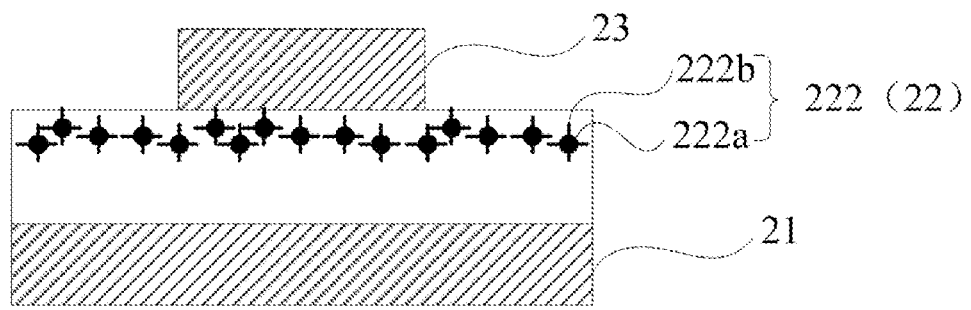
FIG. 2a is a schematic structural diagram of a light-emitting device provided according to an embodiment of the present disclosure.

In view of this, an embodiment of the present disclosure provides a light-emitting device. FIG. 2a is a schematic structural diagram of the light-emitting device provided by the embodiment of the present disclosure. As shown in FIG. 2a, the light-emitting device comprises: a substrate 21, a first carrier transport layer 22 and a light-emitting layer 23. The first carrier transport layer 22 is provided on the substrate 21. The light-emitting layer 23 is disposed on the side of the first carrier transport layer 22 away from the substrate 21. The first carrier transport layer 22 comprises a first transport sublayer 222 close to the light-emitting layer 23, wherein the first transport sublayer 222 comprises nanoparticles 222a and inorganic ligands 222b connected to the surface of the nanoparticles 222a, and the inorganic ligands 222b comprise halogen group elements or oxygen group elements.

In the embodiment of the present disclosure, the first carrier transport layer 22 may be either an electron transport layer or a hole transport layer. For example, when the first carrier transport layer 22 is an electron transport layer, the nanoparticles 222a in the first transport sublayer 222 may be zinc oxide nanoparticles. The light-emitting layer 23 may be either an organic light-emitting layer or a quantum dot layer. For example, when the light-emitting layer 23 is a quantum dot layer, the quantum dot layer may comprise an inorganic quantum dot material, specifically, cadmium sulfide (CdS), which will be described in detail below, and will not be repeated here.

In the embodiment of the present disclosure, since the ligands of the nanoparticles 222a in the first transport sublayer 222 of the light-emitting device are inorganic ligands 222b, the inorganic ligands 222b comprising a halogen group element will not react with oxygen plasma. The inorganic ligands 222b comprising an oxygen group element is divided into the following two cases. In the first case, the inorganic ligands 222b comprise oxygen element, and the oxygen element is in a saturated state in the inorganic ligands 222b. In this case, the inorganic ligands 222b will no longer react with the oxygen plasma. In the second case, the inorganic ligands 222b comprise oxygen element but the oxygen element is in an unsaturated state in the inorganic ligand 222b, or the inorganic ligands 222b contain a non-oxygen element. In this case, the inorganic ligands 222b will undergo an oxidation reaction with the oxygen plasma, but this will not result in ligand loss of the nanoparticles. For example, when the inorganic ligands 222b comprise $MoO_3^-$, the oxygen plasma reacts with $MoO_3^-$ to oxidize it into $MoO_4^-$, which does not result in ligand loss of the nanoparticles. Therefore, when the sacrificial layer is etched with oxygen plasma, even if the oxygen plasma is in contact with the surface of the first carrier transport layer 22 (specifically, in contact with the first transport sublayer 222), the first carrier transporting layer 22 does not suffer from the problem of lack of ligands, thereby addressing the problem of the efficiency reduction of the light-emitting device due to the lack of ligands.

Figure 2B:
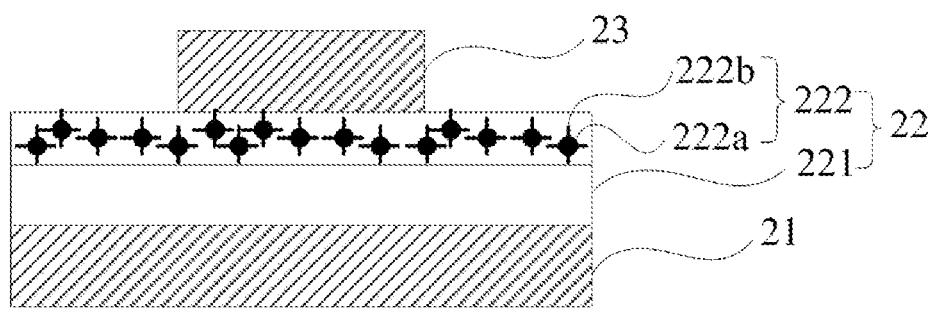
FIG. 2b is a schematic structural diagram of another light-emitting device provided according to an embodiment of the present disclosure.
Figure 3:
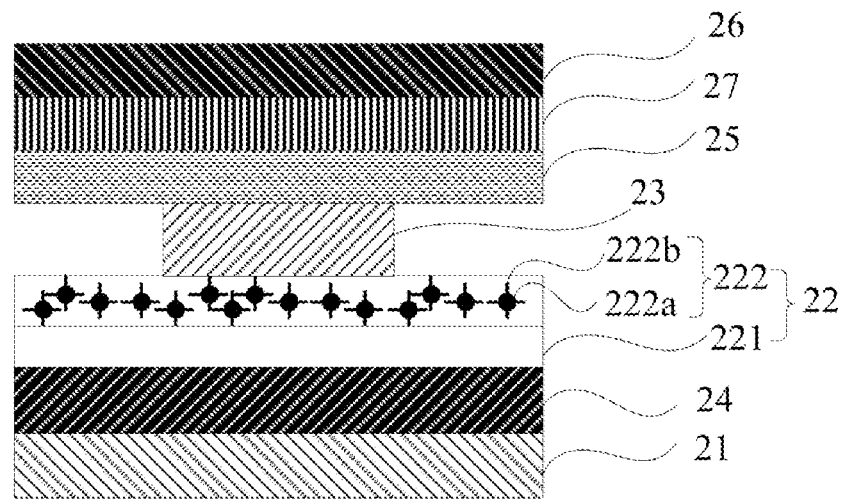
FIG. 3 is a schematic diagram of a specific structure of a light-emitting device provided by an embodiment of the present disclosure.

The specific structure of the light-emitting device according to the embodiment of the present disclosure will be introduced below with reference to FIGS. 2a to 3. FIG. 3 is a schematic diagram of the specific structure of the light-emitting device provided by the embodiment of the present disclosure. As shown in FIG. 3, the light-emitting device comprises: a substrate 21, and a first electrode 24, a first carrier transport layer 22, a light-emitting layer 23, a second carrier transport layer 25 and a second electrode 26 arranged in this order in the direction away from the substrate 21.

In the embodiment of the present disclosure, the light-emitting device may be a top light-emitting structure or a bottom light-emitting structure, which may be determined according to actual needs, and is not limited herein. For example, when the light-emitting device is a top light-emitting structure, the second electrode 26 may be made of a light-transmitting material or a semi-transparent material, specifically, an indium tin oxide (ITO) material or a metal material with a smaller thickness; and the first electrode 24 may be made of a metal material, such as copper. When the light-emitting device is a bottom light-emitting structure, the first electrode 24 may be made of a light-transmitting material, and the second electrode 26 may be made of a metal material.

The light-emitting device may be an upright structure or an inverted structure. For example, when the light-emitting device is the upright structure, the first electrode 24 is an anode, the second electrode 26 is a cathode, the first carrier transport layer 22 is a hole transport layer, and the second carrier transport layer 25 is an electron transport layer. When the light-emitting device L is an inverted structure, the first electrode 24 is a cathode, the second electrode 26 is an anode, the first carrier transport layer 22 is an electron transport layer, and the second carrier transport layer 25 is a hole transport layer. The light-emitting device further comprises: a hole injection layer 27. Taking the inverted structure of the light-emitting device as an example, the hole injection layer 27 is disposed on the side of the second carrier transport layer 25 away from the light-emitting layer 23.

Optionally, in the embodiment of the present disclosure, the light-emitting layer 23 may be a quantum dot layer. The material of the quantum dot layer may comprise inorganic quantum dot materials, such as cadmium sulfide (CdS), cadmium selenide (CdSe), cadmium antimonide (CdTe), zinc selenide (ZnSe), indium phosphide (InP), lead sulfide (PbS), copper indium sulfur (CuInS$_2$), zinc oxide (ZnO), cesium lead chloride (CsPbCl$_3$), cesium lead bromide (CsPbBr$_3$), cesium lead iodide (CsPbI$_3$), cadmium sulfide/Zinc sulfide (CdS/ZnS), cadmium selenide/zinc sulfide (CdSe/ZnS), zinc selenide (ZnSe), indium phosphide/zinc sulfide (InP/ZnS), lead sulfide/zinc sulfide (PbS/ZnS), indium arsenide (InAs), indium gallium arsenide (InGaAs), indium gallium nitride (InGaN), gallium nitride (GaN), zinc telluride (ZnTe), silicon (Si), germanium (Ge), carbon (C), etc., as well as other nanoscale materials comprising the above-mentioned components, such as nanorods, nanosheets. Optionally, in the embodiment of the present disclosure, the material of the quantum dot layer may be a material that does not contain cadmium. Optionally, when the light-emitting structure is an inverted structure, the material of the hole injection layer 27 may comprise poly (3,4-ethylenedioxythiophene)-polystyrene sulfonic acid (PEDOT/PSS); the material of the hole transport layer may comprise poly(9,9-dioctylfluorene-co-N-(4-butylphenyl)di-phenylamine) (TFB), or polyvinylcarbazole (PVK). Optionally, the material of the electron transport layer may comprise one or more of zinc oxide, magnesium zinc oxide, aluminum zinc oxide, zinc lithium zinc oxide, titanium oxide, and aluminum oxide. Specifically, the electron transport layer may be zinc oxide nanoparticle film, or zinc oxide sol-gel film, etc.

When the light-emitting device is an upright structure, the first carrier transport layer 22 is a hole transport layer. Optionally, the material of the hole transport layer may comprise one or more of nickel oxide, tungsten oxide, cuprous oxide, and molybdenum oxide. Specifically, the hole transport layer may be a nickel oxide nanoparticle film, nickel oxide sol-gel film, or the like.

In some embodiments of the present disclosure, the first carrier transport layer 22 as a whole may serve as the first transport sublayer 222. FIG. 2b is a schematic structural diagram of another light-emitting device provided by an embodiment of the present disclosure. As shown in FIG. 2b, the first carrier transport layer 22 may further comprise a second transport sublayer 221, wherein the second transport sublayer 221 is located on the side of the first transport sublayer 222 away from the light-emitting layer 23. Both the first transport sublayer 222 and the second transport sublayer 221 may comprise nanoparticles 222a and ligands connected to the surface of the nanoparticles 222a, wherein the second transport sublayer 221 does not comprise inorganic ligands. Illustratively, the ligands in the second transport sublayer 221 are all organic ligands, and the organic ligands may comprise ethanolamine, for example. The ligands in the first transporting sublayer 222 are inorganic ligands 222b, and the inorganic ligands 222b in the first transport sublayer 222 may specifically comprise: halogen group elements; or, halogen group elements and metallic elements; or, oxygen group elements and metallic elements.

When the inorganic ligand 222b comprises a halogen group element, the inorganic ligand 222b is represented by the general formula of B$^-$, wherein B is a halogen group element. Optionally, B may specifically comprise any one of iodine (I), chlorine (Cl), bromine (Br), and fluorine (F). For example, the inorganic ligand 222b may be I$^-$.

When the inorganic ligand 222b comprises a halogen group element and a metallic element, the inorganic ligand 222b is represented by a general formula: $AB_x^{y-}$, wherein A is a metallic element, and B is a halogen group element. A specifically may comprise any one of zinc (Zn), cadmium (Cd), mercury (Hg), copper (Cu), silver (Ag), and gold (Au), and wherein x and y are both positive integers. For example, the inorganic ligand 222b may be $CdCl_4^-$, that is, x=4, and y=1; or the inorganic ligand 222b may be $AgI_2^-$, that is, x=2, and y=1. The specific combination form of the above elements can be determined according to actual needs and will not be listed one by one in the embodiments of the present disclosure, as long as the combination form of the above elements can satisfy the general formula $AB_x^{y-}$.

In the embodiment of the present disclosure, the preparation process of the first carrier transport layer 22 is described by taking $CdCl_4^-$ as an example of the inorganic ligand 222b. When preparing the first carrier transport layer 22, an ethanol solution containing zinc oxide nanoparticles may be firstly formed on the first electrode 24, and the solution is solidified to form an initial carrier transport layer. The initial carrier transport layer comprises zinc oxide nanoparticles and organic ligands connected to the surface of the zinc oxide nanoparticles, such as ethanolamine. Afterwards, a first solution layer containing an inorganic ligand 222b is formed on the initial carrier transport layer. For example, the first solution layer may be a N,N-dimethylformamide solution of [Ph$_2$I]$_2$[CdCl$_4$]. The resultant is allowed to stand for 30 seconds to exchange ligands between the first solution layer and the initial carrier transport layer, that is, to have $CdCl_4^-$ in the first solution layer replace ethanolamine in the initial carrier transport layer, so that $CdCl_4^-$ serves as the inorganic ligand 222b of the zinc oxide nanoparticles, thereby obtaining the first carrier transport layer 22 including the first transport sublayer 222. In some examples, by controlling the concentration of zinc oxide nanoparticles in the ethanol solution, or by controlling the time of ligand exchange between the first solution layer and the initial carrier transport layer, ligand exchange can occur between a portion of the initial carrier transport layer and the first solution layer, while the other portion does not undergo ligand exchange with the first solution layer, thereby obtaining the first carrier transport layer 22 including the first transport sublayer 222 and the second transport sublayer 221.

When the inorganic ligand 222b comprises an oxygen group element and a metallic element, the inorganic ligand is represented by the general formula: $MJ_x^{y-}$ or $M_zJ_x^{y-}$; wherein, J is an oxygen group element, M is a metallic element, and x, y and z are all positive integers. J may specifically comprise any one of oxygen (O), sulfur (S), selenium (Se), and tellurium (Te), and M may specifically comprise molybdenum (Mo), chromium (Cr), tungsten (W), iron (Fe), ruthenium (Ru), osmium (Os), cobalt (Co), rhodium (Rh), aluminum (Al), gallium (Ga), indium (In), germanium (Ge), tin (Sn), lead (Pb), antimony (Sb), and bismuth (Bi).

The inorganic ligand 222b in the first carrier transport layer 22 may be obtained by the following ways. The first way is to perform ligand exchange between the first solution containing the inorganic ligand 222b and the first carrier transport layer 22. The second way is as follows: firstly, a second solution containing an initial inorganic ligand is formed on the first carrier transport layer 22, and the second solution firstly undergoes ligand exchange with the first carrier transport layer 22 to obtain the initial carrier transport layer comprising the initial inorganic ligand; then the initial inorganic ligand is oxidized to obtain the final inorganic ligand 222b. In the second way, the inorganic ligand 222b is obtained by oxidizing an initial inorganic ligand including oxygen element and a metallic element; or the inorganic ligand 222b is obtained by oxidation of the initial inorganic ligand including a non-oxygen element of the oxygen group elements and a metallic element.

Specifically, when the inorganic ligand 222b is obtained by oxidizing the initial inorganic ligand including oxygen element and a metallic element, the general formula of the initial inorganic ligand may be $M'J'_x^{y-}$, wherein M' is a metallic element, which may specifically comprise any one of molybdenum (Mo), chromium (Cr), tungsten (W), iron (Fe), ruthenium (Ru), osmium (Os), cobalt (Co), rhodium (Rh), aluminum (Al), gallium (Ga) and indium (In); J' is oxygen (O), and in the initial inorganic ligand, oxygen is in an unsaturated state. The general formula of the inorganic ligand 222b is $MJ_x^{y-}$, wherein M is a metallic element, which may specifically comprise any one of molybdenum (Mo), chromium (Cr), tungsten (W), iron (Fe), ruthenium (Ru), osmium (Os), cobalt (Co), rhodium (Rh), aluminum (Al), gallium (Ga), and indium (In); and J comprises oxygen (O). In the formulae, x and y are both positive integers. For example, the initial inorganic ligand may be $MoO_4^{2-}$, that is, x=4, and y=2; or the initial inorganic ligand 222b may be $MoO_3^-$, that is, x=3, and y=1. The inorganic ligand 222b may be $MoO_4^-$, that is, x=4, and y=1. Optionally, the initial inorganic ligand may also be $CrO_3^{2-}$, that is, x=3, and y=2; or $AlO_2^{2-}$, that is, x=2, and y=2; or $FeO_2^-$, that is, x=2, and y=1, etc. The inorganic ligands 222b are those obtained by oxidation of the above-mentioned initial inorganic ligands, and will not be listed one by one in the embodiments of the present disclosure.

In the embodiment of the present disclosure, the preparation process of the first carrier transport layer 22 is described by taking $MoO_4^-$ as an example of the inorganic ligand 222b. When preparing the first carrier transport layer 22, an ethanol solution containing zinc oxide nanoparticles may be firstly formed on the first electrode 24 and solidified to obtain an initial carrier transport layer. The initial carrier transport layer comprises zinc oxide nanoparticles and organic ligands connected to the surface of the zinc oxide nanoparticles, and the organic ligand may be, for example, ethanolamine. Afterwards, a second solution layer containing an initial inorganic ligand is formed on the initial carrier transport layer. For example, the initial inorganic ligand may be $MoO_3^-$, and the second solution layer may be a solution of $NaMoO_3$ in N-methylpyrrolidone. The resultant is allowed to stand for 30 seconds, so that the second solution layer exchanges ligands with the initial carrier transport layer, that is, $MoO_3^-$ in the second solution layer replaces ethanolamine in the initial carrier transport layer, thereby $MoO_3^-$ serves as the initial inorganic ligand of zinc oxide nanoparticles. In the subsequent process steps, the oxygen plasma used for etching the sacrificial layer can be used to oxidize the initial inorganic ligand, that is, to oxidize $MoO_3^-$ into $MoO_4^-$ which serves as the inorganic ligand 222b of the zinc oxide nanoparticles, thereby obtaining the first carrier transport layer 22 comprising the first transport sublayer 222. In some examples, by controlling the concentration of the solution of $NaMoO_3$ in N-methylpyrrolidone, or by controlling the time of ligand exchange between the second solution layer and the initial carrier transport layer, ligand exchange can occur between a part of the initial carrier transport layer and the second solution layer, while the other part does not undergo ligand exchange with the second solution layer, thereby obtaining the first carrier transport layer 22 comprising the first transport sublayer 222 and the second transport sublayer 221.

When the inorganic ligand 222b is obtained by oxidizing an initial inorganic ligand including a non-oxygen element of the oxygen group elements and a metallic element, the general formula of the initial inorganic ligand may be $M'_zJ'_x^{y-}$, wherein M' comprises a metallic element, which may specifically comprise any one of germanium (Ge), tin (Sn), lead (Pb), antimony (Sb) and bismuth (Bi); and J' comprises sulfur (S), selenium (Se), tellurium (Te), etc. The general formula of the inorganic ligand 222b may be $M_zJ_x^{y-}$, wherein M comprises a metallic element, which may specifically comprise any one of germanium (Ge), tin (Sn), lead (Pb), antimony (Sb), and bismuth (Bi), and J comprises oxygen (O). In the formulae, x, y and z are all positive integers. For example, the initial inorganic ligand can be $Sn_2S_3^{2-}$, that is, z=2, x=3, and y=2; and the inorganic ligand 222b can be $Sn_2O_3^{2-}$, that is, z=2, x=3, and y=2. Optionally, the initial inorganic ligand 222b can also be $Te_2Sn_6^{4-}$, that is, z=2, x=6, and y=4. The inorganic ligands 222b are those obtained by oxidation of the above-mentioned initial inorganic ligands, and are not listed one by one in the embodiments of the present disclosure.

In the embodiment of the present disclosure, the preparation process of the first carrier transport layer 22 is described by taking $Sn_2O_3^{2-}$ as an example of the inorganic ligand 222b. When preparing the first carrier transport layer, an ethanol solution containing zinc oxide nanoparticles may be firstly formed on the first electrode 24 and solidified to obtain an initial carrier transport layer. The initial carrier transport layer comprises zinc oxide nanoparticles and an organic ligand connected to the surface of the zinc oxide nanoparticles, and the organic ligand may be, for example, ethanolamine. Afterwards, a second solution layer containing an initial inorganic ligand is formed on the initial carrier transport layer. For example, the initial inorganic ligand may be $Sn_2S_3^{2-}$, and the second solution layer may be a solution of $Na_2Sn_2S_3$ in N-methylpyrrolidone. The resultant is allowed to stand for 30 seconds to exchange ligands between the second solution layer and the initial carrier transport layer, that is, to replace the ethanolamine in the initial carrier transport layer with $Sn_2S_3^{2-}$ in the second solution layer, so that $Sn_2S_3^{2-}$ serves as the initial inorganic ligand of ZnO nanoparticles. When the sacrificial layer is etched with oxygen plasma in a subsequent process step, $Sn_2S_3^{2-}$ will be oxidized to $Sn_2O_3^{2-}$, so that $Sn_2O_3^{2-}$ serves as the inorganic ligand 222b of the zinc oxide nanoparticles.

It should be noted that, in the embodiments of the present disclosure, the initial inorganic ligands may be partially oxidized or fully oxidized. When the initial inorganic ligands are partially oxidized, the inorganic ligands 222b in the first carrier transport layer 22 comprise oxygen element, a non-oxygen element of the oxygen group elements and a metallic element. When the initial inorganic ligands are all oxidized, the inorganic ligands 222b in the first carrier transport layer 22 comprise oxygen element and a metallic element.

In other specific embodiments, the inorganic ligands 222b may also comprise oxygen element and a non-metallic element. The non-metallic element may be, for example, arsenic (As) or phosphorus (P). When the inorganic ligands 222b comprise oxygen element and a non-metallic element, the inorganic ligands 222b in the first carrier transport layer 22 can be obtained by performing ligand exchange between the first solution containing the inorganic ligands 222b and the first carrier transport layer 22; or by forming a second solution containing initial inorganic ligands on the first carrier transport layer 22, and performing ligand exchange between the second solution and the first carrier transport layer 22 to obtain the initial carrier transport layer containing the initial inorganic ligands; then oxidizing the initial inorganic ligands to obtain the final inorganic ligands 222b. Among them, the initial inorganic ligands comprise oxygen element and non-metallic elements. Specifically, the general formula of the initial inorganic ligand may be $Q'R'^{y-}_x$, wherein Q' is a non-metallic element, which may specifically comprise arsenic (As) or phosphorus (P), and R' is an oxygen group element. Specifically, R' may be oxygen (O), sulfur (S), selenium (Se), or tellurium (Te). The general formula of the inorganic ligand 222b is $QR_x^{y-}$, wherein Q is a non-metallic element, which may specifically comprise arsenic (As) or phosphorus (P), and R comprises oxygen (O). In the formulae, x and y are both positive integers. The specific preparation process is similar to the preparation method described in the embodiment in which the initial inorganic ligand comprises oxygen element and a metallic element, and is not repeated here.

Figure 4:
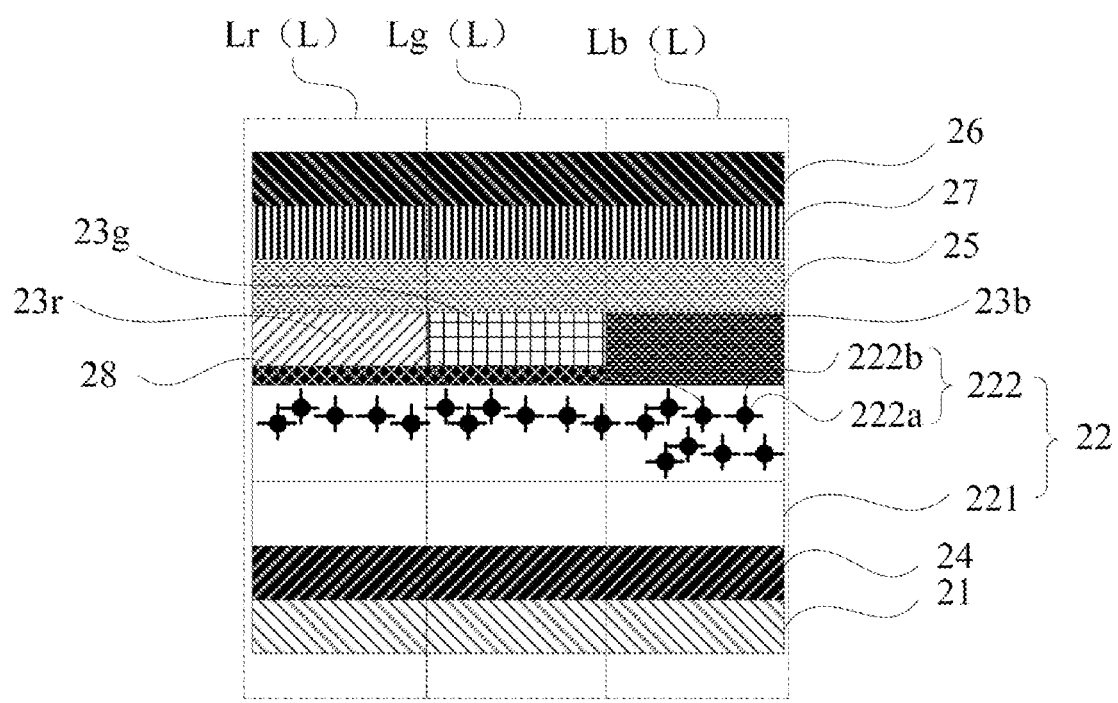
FIG. 4 is a schematic structural diagram of a display substrate provided by an embodiment of the present disclosure.

An embodiment of the present disclosure further provides a display substrate. FIG. 4 is a schematic structural diagram of the display substrate provided by an embodiment of the present disclosure. As shown in FIG. 4, the display substrate comprises: a plurality of light-emitting devices L, wherein at least one of the plurality of light-emitting devices L adopts the light-emitting device of the above embodiments.

In the embodiments of the present disclosure, when oxygen plasma is used for etching, the first transport sublayer 222 in contact with the oxygen plasma does not suffer from the problem of ligand loss, thereby addressing the problem of reduction in the efficiency of the light-emitting device due to the ligand loss.

In an embodiment of the present disclosure, each of the plurality of light-emitting devices in the display substrate adopts the light-emitting device of the above embodiments, wherein the plurality of light-emitting devices comprise a plurality of first light-emitting devices and a plurality of second light-emitting devices.

When the light-emitting device does not use the above-mentioned inorganic ligands 222b, the first light-emitting device may be of a less-electron system, and the second light-emitting device may be of a more-electron system. That is, for the first light-emitting device, when the above-mentioned inorganic ligand is not used, the number of electrons reaching the light-emitting layer 23 per unit time may be less than the number of holes reaching the light-emitting layer 23 per unit time, and the ratio of the number of electrons reaching the light-emitting layer 23 per unit time to the number of holes reaching the light-emitting layer 23 per unit time may not fall within a preset range. For the second light-emitting device, when the above-mentioned inorganic ligand is not used, the number of electrons reaching the light-emitting layer 23 per unit time may be more than the number of holes reaching the light-emitting layer 23 per unit time, and the ratio of the number of electrons reaching the light-emitting layer 23 per unit time to the number of holes reaching the light-emitting layer 23 per unit time may not fall within the preset range. The preset range is defined as the ratio of the number of electrons reaching the light-emitting layer 23 per unit time to the number of holes reaching the light-emitting layer 23 per unit time when the luminous efficiency of the light-emitting device reaches a desired value.

When the number of electrons reaching the light-emitting layer 23 per unit time is different from the number of holes reaching the light-emitting layer 23 per unit time, electron-hole injection imbalance may be caused. When the ligands of the nanoparticles 222a in the first transport sublayer 222 of the light-emitting device L are inorganic ligands 222b, the chains of the inorganic ligands 222b are shorter compared with the scheme using organic ligands in the traditional light-emitting devices. Therefore, the carrier transport rate of the first carrier transport layer 22 is increased, thereby increasing the number of carriers reaching the light-emitting layer 23 per unit time. Exemplarily, when the first carrier transport layer 22 of the first light-emitting device is an electron transport layer, the electron transport rate of the first light-emitting device increases after the inorganic ligand 222b is used, so that in the first light-emitting device, the ratio of the number of electrons reaching the light-emitting layer 23 per unit time to the number of holes reaching the light-emitting layer 23 per unit time is within a preset range, and thus the first light-emitting device achieves an electron-hole injection balance.

In order to achieve the electron-hole injection balance for each light-emitting device L, in the implementation of the present disclosure, the structure of each light-emitting device is set according to the following methods: changing the thickness of the first carrier transport layer 22, or adding a carrier blocking layer 28 in the light-emitting device L to adjust the carrier transport rate, so that in each light-emitting device L, the ratio of the number of electrons reaching the light-emitting layer 23 per unit time to the number of holes reaching the light-emitting layer 23 per unit time is within the preset range, and the electron-hole injection balance is reached.

Hereinafter, taking the light-emitting device L in an inverted structure as an example, as shown in FIG. 4, the light-emitting device L comprises a substrate 21, and a first electrode 24, a first carrier transport layer 22, a light-emitting layer 23, a second carrier transport layer 25 and a second electrode 26 arranged in sequence along a direction away from the substrate 21. The first electrode 24 is a cathode, the second electrode 26 is an anode, the first carrier transport layer 22 is an electron transport layer, and the second carrier transport layer 25 is a hole transport layer. Optionally, a hole injection layer 27 may also be provided between the hole transport layer and the second electrode 26.

In some specific embodiments, an electron blocking layer (i.e., the carrier blocking layer 28 in FIG. 4) may be provided in a plurality of second light-emitting devices, and the electron blocking layer is located between the electron transport layer and the light-emitting layer 23 of the second light-emitting device. The electron blocking layer can slow down the electron transport rate, so that in the second light-emitting device, the ratio of the number of electrons reaching the light-emitting layer 23 per unit time to the number of holes reaching the light-emitting layer 23 per unit time is within a preset range, and the electron-hole injection balance is achieved. In the first light-emitting device, the number of electrons reaching the light-emitting layer per unit time is originally lower than the number of holes. When the ligand of the first transport sublayer 222 in the first light-emitting device is the inorganic ligand 222b, the electron transport rate is increased, which is beneficial for the first light-emitting device to reach the electron-hole injection balance. Therefore, the electron blocking layer does not need to be provided in the first light-emitting device. Optionally, the electron blocking layer can be prepared by using a photosensitive material, for example, acrylic, epoxy, isoprene, azide-based resin or the like. In this way, the electron blocking layer can be formed only in the second light-emitting device after exposure and development using a photolithography process.

In other specific embodiments, when the first carrier transport layer 22 is an electron transport layer, the thickness of the first carrier transport layer 22 in each of the plurality of second light-emitting devices is greater than the thickness of the first carrier transport layer 22 in each of the plurality of first light-emitting devices. By increasing the thickness of the first carrier transport layer 22, the electron transport rate can also be reduced, so that the second light-emitting device can reach the electron-hole injection balance.

In other specific embodiments, the carrier transport rate in the light-emitting device L can also be adjusted by adjusting the doping concentration of the inorganic ligand 222b in the light-emitting device L. The doping concentration may, for example, refer to the ratio of the mass of the inorganic ligand to the mass of the nanoparticles in the first carrier transport layer. Specifically, the doping concentration of the inorganic ligand 222b in the first carrier transport layer 22 of the second light-emitting device is smaller than the doping concentration of the inorganic ligand 222b in the first carrier transport layer 22 of the first light-emitting device. In the embodiment of the present disclosure, since the inorganic ligands 222b in the electron transport layer can improve the electron transport rate, less inorganic ligands 222b are provided in the electron transport layer of the second light-emitting device to prevent the electron transport rate from rising too much due to the addition of the inorganic ligands and resulting in electron-hole injection imbalance. However, more inorganic ligands 222b are provided in the electron transport layer of the first light-emitting device, so that the electron transport rate of the first light-emitting device can be increased, thereby the number of electrons reaching the light-emitting layer 23 per unit time is increased, and the ratio of the number of electrons to the number of holes reaching the light-emitting layer 23 per unit time is within a preset range, and the electron-hole injection balance is achieved.

In the embodiment of the present disclosure, when the ligand is exchanged for the first carrier transport layer 22, the doping concentration of the inorganic ligand 222b in the finally formed first carrier transport layer 22 is controlled by controlling the concentration of the inorganic ligand 222b in the solution formed on the first carrier transport layer 22, and/or the ligand exchange time. For example, the ligand exchange time for the first light-emitting device is longer (or the concentration of the inorganic ligand 222b in the solution is higher), while the ligand exchange time for the second light-emitting device is shorter (or the concentration of the inorganic ligand 222b in the solution is lower), so that the doping concentration of the inorganic ligands 222b in the first carrier transport layer 22 of the second light-emitting device is smaller than the doping concentration of the inorganic ligands 222b in the carrier transport layer 22 of the first light-emitting device.

In other specific embodiments, the light-emitting device L may also be an upright structure. In this case, the light-emitting device L comprises a substrate 21 and a first electrode 24, a first carrier transport layer 22, a light-emitting layer 23, a second carrier transport layer 25 and a second electrode 26. The first electrode 24 is an anode, the second electrode 26 is a cathode, the first carrier transport layer 22 is a hole transport layer, and the second carrier transport layer 25 is an electron transport layer. Optionally, a hole injection layer may also be provided between the hole transport layer and the first electrode 24.

In some specific embodiments, a hole blocking layer can be arranged between the first carrier transport layer 22 and the light-emitting layer 23 of the first light-emitting device, which can slow down the hole transport rate in the first light-emitting device, so that in the first light-emitting device, the ratio of the number of electrons to the number of holes reaching the light-emitting layer 23 per unit time is within a preset range, thereby the first light-emitting device achieves an electron-hole injection balance.

In some specific embodiments, the thickness of the first carrier transport layer 22 of each first light-emitting device is greater than the thickness of the first carrier transport layer 22 of each second light-emitting device. By increasing the thickness of the first carrier transport layer 22, the hole transport rate of the first light-emitting device can also be slowed down, so that the number of holes reaching the light-emitting layer 23 per unit time is reduced, thereby in the first light-emitting device, the ratio of the number of electrons to the number of holes reaching the light-emitting layer 23 per unit time is within a preset range, and the electron-hole injection balance is achieved.

In some specific embodiments, the carrier transport rate of the light-emitting device L can also be adjusted by adjusting the doping concentration of the inorganic ligand 222b in the light-emitting device L. Specifically, the doping concentration of the inorganic ligand 222b in the first carrier transport layer 22 of the second light-emitting device is greater than the doping concentration of the inorganic ligand 222b in the first carrier transport layer 22 of the first light-emitting device. In the embodiment of the present disclosure, since the inorganic ligands 222b in the hole transport layer can improve the hole transport rate, less inorganic ligands 222b are provided in the hole transport layer of the first light-emitting device to prevent the hole transport rate from rising too much due to the addition of the inorganic ligands and resulting in electron-hole injection imbalance. On the other hand, more inorganic ligands 222b are provided in the hole transport layer of the second light-emitting device, so that the hole transport rate of the second light-emitting device can be improved, and the number of the holes reaching the light-emitting layer 23 of the second light-emitting device per unit time is increased. As such, the ratio of the number of electrons reaching the light-emitting layer 23 to the number of holes reaching the light-emitting layer 23 per unit time is within a preset range, and the electron-hole injection balance is achieved.

In some embodiments of the present disclosure, as shown in FIG. 4, each of the above-mentioned first light-emitting devices may be a blue quantum dot light-emitting device Lb, and the plurality of second light-emitting devices may comprise a plurality of red quantum dot light-emitting devices Lr and/or a plurality of green quantum dot light-emitting devices Lg. Among them, the blue quantum dot light-emitting device Lb is a less-electron system, and the red quantum dot light-emitting device Lr and the green quantum dot light-emitting device Lg are more-electron systems. That is, for the blue quantum dot light-emitting device Lb, when the above-mentioned inorganic ligand is not used, the number of electrons reaching the light-emitting layer 23 per unit time may be less than the number of holes, and the ratio of the number of electrons reaching the light-emitting layer 23 to the number of holes reaching the light-emitting layer 23 per unit time may not fall within the preset range. For the red quantum dot light-emitting device Lr and the green quantum dot light-emitting device Lg, when the above-mentioned inorganic ligands are not used, the number of electrons reaching the light-emitting layer 23 per unit time may be more than the number of holes, and the ratio of the number of electrons to the number of holes reaching the light-emitting layer 23 per unit time may not fall within the preset range. Exemplarily, the first carrier transport layer 22 is an electron transport layer. In this case, after the inorganic ligand 222b is used in the first carrier transport layer 22, the electron transport rate of the blue quantum dot light-emitting device Lb is increased, so that in the blue quantum dot light-emitting device Lb, the ratio of the number of electrons to the number of holes that reach the light-emitting layer 23 per unit time is within a preset range, thereby the blue quantum dot light-emitting device Lb reaches electron-hole injection balance. In order to make each light-emitting device L achieve electron-hole injection balance, it is possible to set the structure of the blue quantum dot light-emitting device Lb, the red quantum dot light-emitting device Lr and the green quantum dot light-emitting device Lg according to the description of the first and second light-emitting devices, and details are not repeated here.

It should be noted that, in the embodiments of the present disclosure, the doping concentrations of the inorganic ligands 222b in the plurality of second light-emitting devices may be the same or different, which may be determined according to actual needs, and are not limited herein. For example, when the plurality of second light-emitting devices comprise a plurality of red quantum dot light-emitting devices Lr and a plurality of green quantum dot light-emitting devices Lg, the doping concentration of the inorganic ligand 222b in the red quantum dot light-emitting device Lr can be set lower than the doping concentration of the inorganic ligand 222b in the green quantum dot light-emitting device Lr.

Embodiments of the present disclosure also provide a display device, which may be any product or component with a display function, such as electronic paper, mobile phone, tablet computer, TV, monitor, notebook computer, digital photo frame, and navigator. The display device comprises the above-mentioned display substrate.

Figure 5:
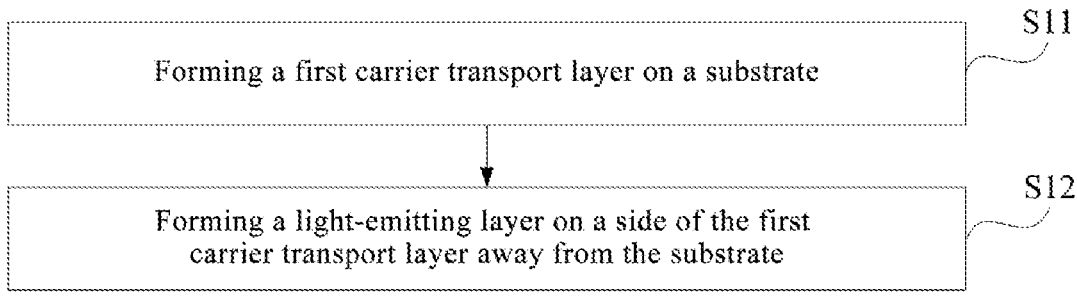
FIG. 5 is one of the flow charts of the preparation method provided by the embodiment of the present disclosure.

An embodiment of the present disclosure further provides a method for preparing a light-emitting device. FIG. 5 is one of the flow charts of the preparation method provided by the embodiment of the present disclosure. As shown in FIG. 5, the preparation method comprises the following steps:

S11, forming a first carrier transport layer on a substrate.

S12, forming a light-emitting layer on the side of the first carrier transport layer away from the substrate.

The first carrier transport layer comprises a first transport sublayer close to the light-emitting layer, wherein the first transport sublayer comprises nanoparticles and inorganic ligands connected to the surface of the nanoparticles, and wherein the inorganic ligands comprise halogen group elements or oxygen group elements.

In the embodiments of the present disclosure, when oxygen plasma is used for etching, the first transport sublayer in contact with the oxygen plasma will not suffer from the problem of ligand loss, thereby addressing the problem in reduction of the efficiency of the light-emitting device L due to the ligand loss.

In some embodiments, the first carrier transport layer as a whole may serve as the first transport sublayer, or the first carrier transport layer may further comprise a second transport sublayer, wherein the second transport sublayer is located on the side of the first transport sublayer away from the light-emitting layer. Both the first transport sublayer and the second transport sublayer may comprise nanoparticles and ligands connected to the surface of the nanoparticles, wherein the second transport sublayer does not comprise inorganic ligands.

Exemplarily, the ligands in the second transport sublayer are all organic ligands, which may comprise, for example, ethanolamine. The ligands in the first transport sublayer are inorganic ligands, and the inorganic ligands in the first transport sublayer may specifically comprise: halogen group elements; or halogen group elements and metallic elements; or oxygen group elements and metallic elements.

In the embodiments of the present disclosure, the light-emitting device may be an upright structure or an inverted structure. For example, when the light-emitting device is an upright structure, the first electrode is an anode, the second electrode is a cathode, the first carrier transport layer is a hole transport layer, and the second carrier transport layer is an electron transport layer. When the light-emitting device is an inverted structure, the first electrode is a cathode, the second electrode is an anode, the first carrier transport layer is an electron transport layer, and the second carrier transport layer is a hole transport layer. Optionally, the light-emitting device may further comprise a hole injection layer. Taking the light-emitting device of an inverted structure as an example, the hole injection layer is disposed on the side of the second carrier transport layer away from the light-emitting layer.

Figure 6:
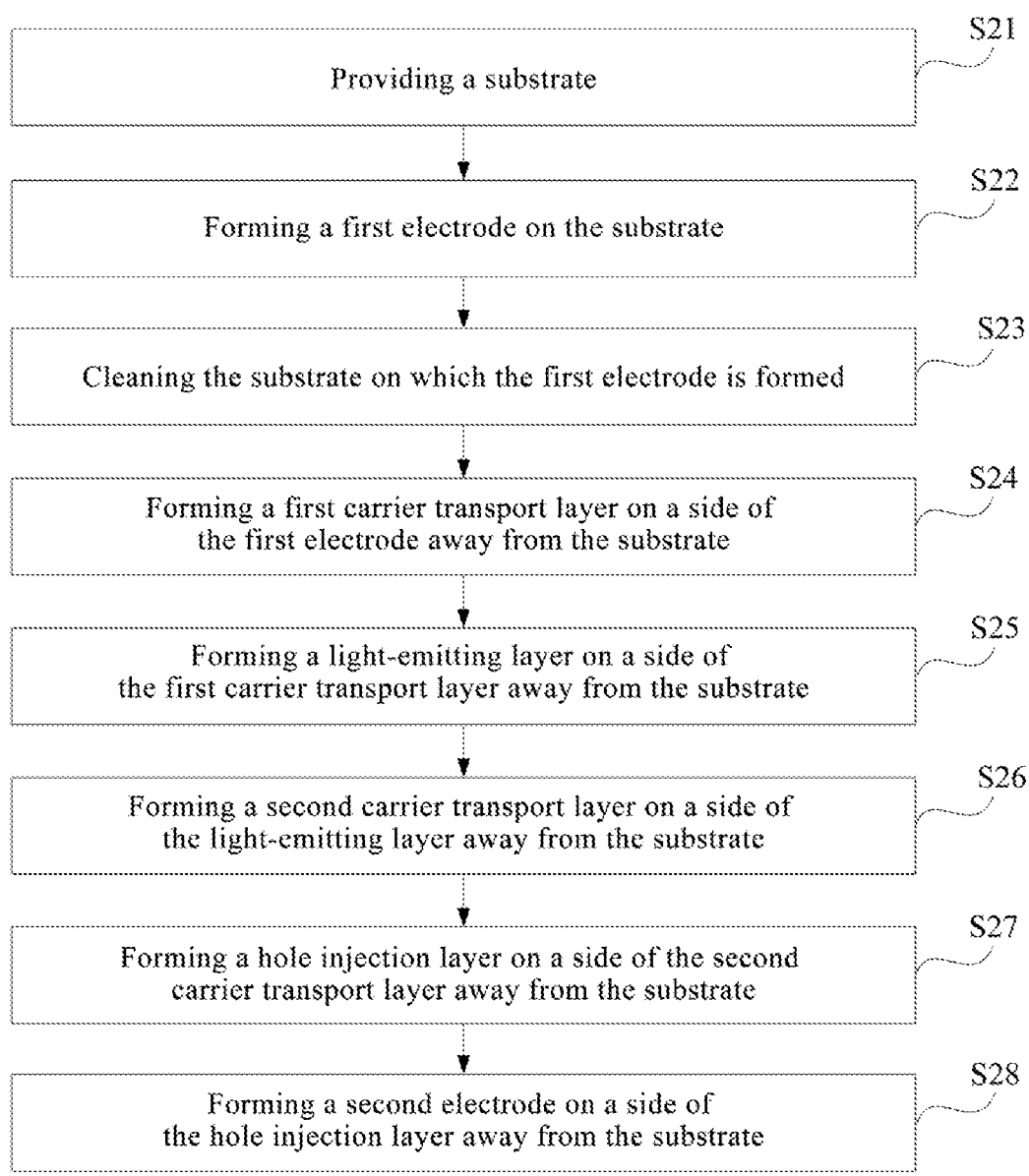
FIG. 6 is a second flow chart of the method for fabricating a light-emitting device provided by an embodiment of the present disclosure.
Figure 7A:
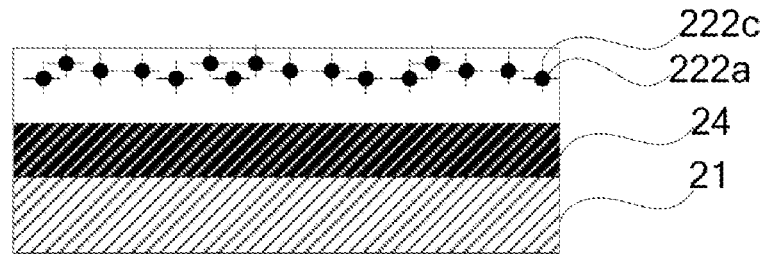
FIGS. 7a to 7g are schematic diagrams of the preparation process of the light-emitting device provided by embodiments of the present disclosure.
Figure 7B:
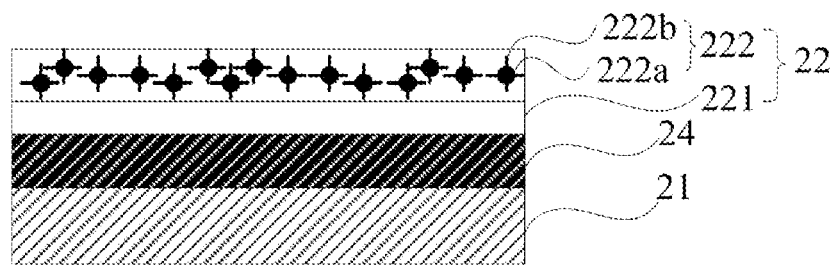
Figure 7C:
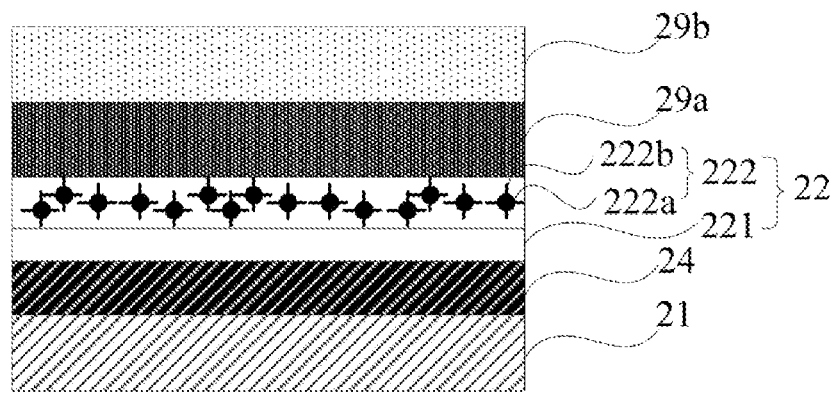
Figure 7D:
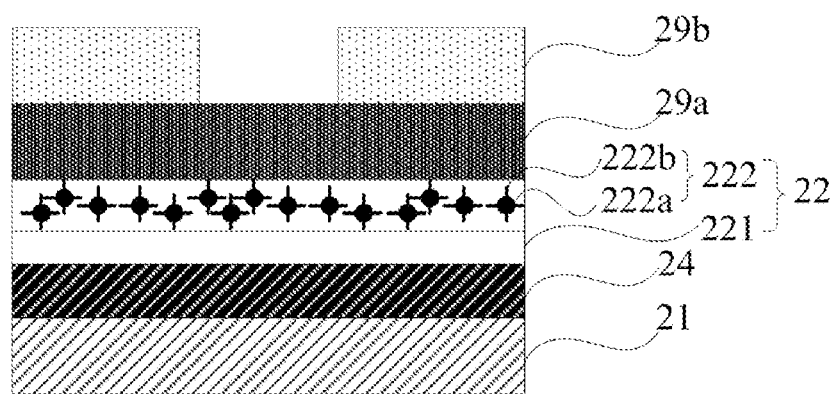
Figure 7E:
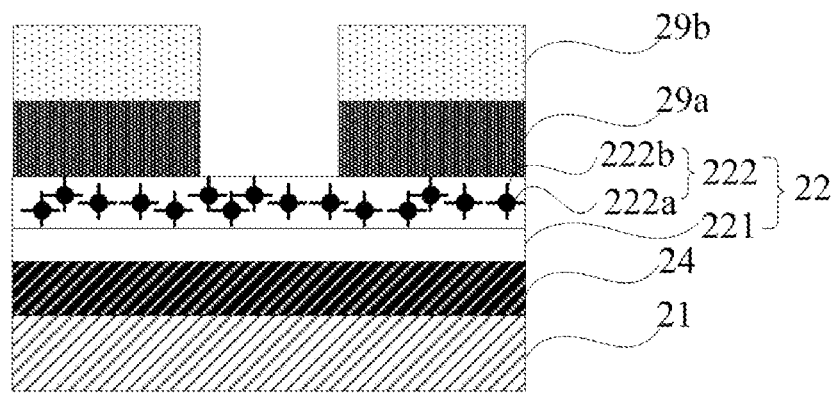
Figure 7F:
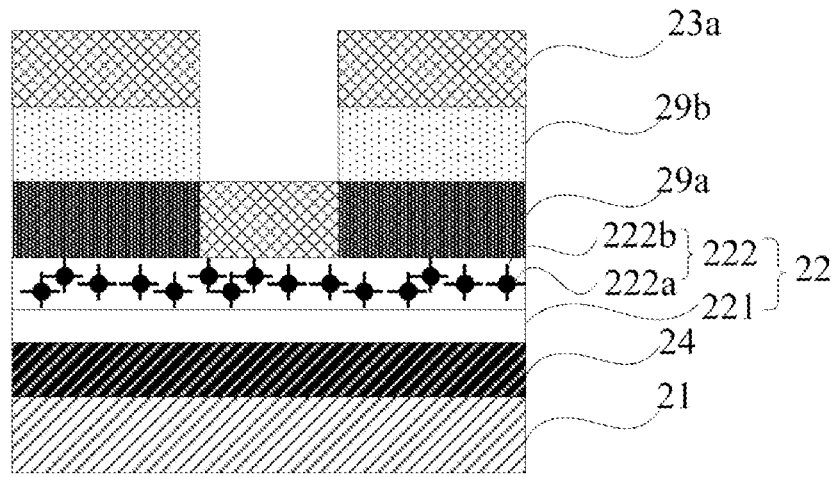
Figure 7G:
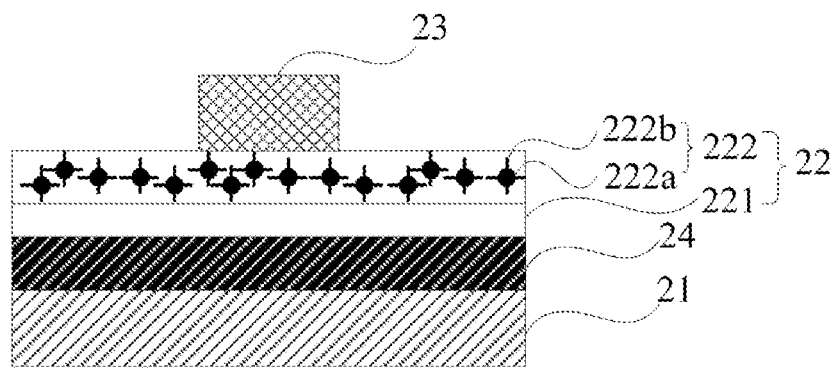

The method for manufacturing the light-emitting device according to the embodiment of the present disclosure will be described below by taking the light-emitting device of an inverted structure as an example. In the embodiment of the present disclosure, the inorganic ligand 222b comprises a halogen group element and a metallic element. Exemplarily, the inorganic ligand 222b is $CdCl_4^-$. FIG. 6 is the second flow chart of the method for manufacturing a light-emitting device provided by the embodiment of the present disclosure, and FIGS. 7a to 7g are schematic diagrams of the manufacturing process of the light-emitting device provided by the embodiment of the present disclosure. As shown in FIGS. 7a to 7g in combination with FIG. 6, the preparation method of the light-emitting device provided by the embodiment of the present disclosure comprises the following steps:

S21, providing the substrate 21.

S22, forming the first electrode 24 on the substrate 21. The first electrode 24 may be a cathode, the material of the first electrode 24 may comprise metal, and the light-emitting device L may be a bottom emission structure or a top emission structure, which is determined according to actual needs and is not limited herein. For example, when the light-emitting device L has a bottom emission structure, the first electrode 24 may be made of a transparent metal material, such as indium tin oxide. When the light-emitting device L has a top emission structure, the first electrode 24 may be made of a non-transparent metal material, such as copper. In this step, the first electrode 24 may be formed by a process such as evaporation or sputtering.

S23, cleaning the substrate 21 on which the first electrode 24 is formed. In this step, isopropyl alcohol, water and acetone solution may be used, and the substrate 21 on which the first electrode 24 is formed may be cleaned by ultrasonic waves. Further, the substrate 21 on which the first electrode 24 is formed may also be treated by ultraviolet UV light, and the duration time may be set in a range of 5 min to 10 min.

S24, forming the first carrier transport layer 22 on the side of the first electrode 24 away from the substrate 21. The first carrier transport layer 22 is an electron transport layer. In this step, the electron transport layer comprises a zinc oxide nanoparticle film. Specifically, the zinc oxide nanoparticle film may be formed by spin-coating an ethanol solution containing zinc oxide nanoparticles on the side of the first electrode 24 away from the substrate 21. The concentration of the ethanol solution containing zinc oxide nanoparticles is 30 mg/ml, and the ligand is an organic ligand 222c, such as ethanolamine. The spin coating speed is set between 2000 rpm and 4000 rpm, e.g. 3000 rpm. Afterwards, the solution of $[Ph_2I]_2[CdCl_4]$ in N,N-dimethylformamide is added dropwise onto the zinc oxide nanoparticle film. The concentration of $[Ph_2I]_2[CdCl_4]$ in N,N-dimethylformamide is 5 mg/ml to 20 mg/ml, e.g., 10 mg/ml. The resultant is allowed to stand for 30 s for ligand exchange. Spin-coating is then performed to obtain the initial carrier transport layer, and the spin-coating speed may be set between 1000 rpm and 3000 rpm, for example, 2000 rpm. Finally, the first carrier transport layer 22 is obtained after subjected to annealing. The annealing temperature may be set at 60° C. to 180° C., e.g., 120° C., and the annealing time may be set at 5 minutes to 15 minutes, e.g., 10 minutes. By adjusting the ligand exchange time or other process conditions, the entire first carrier transport layer may serve as the first transport sublayer, or the first carrier transport layer may comprise a first transport sublayer and a second transport sublayer.

S25, forming the light-emitting layer 23 on the side of the first carrier transport layer 22 away from the substrate 21. As shown in FIGS. 7b to 7e, it may specifically comprise steps S251a to S256a:

S251a, forming a sacrificial layer 29a on the side of the first carrier transport layer 22 away from the substrate 21. Specifically, the sacrificial layer 29a is formed by spin-coating an ethanol solution of polyvinylpyrrolidone on the first carrier transport layer 22, wherein the concentration of polyvinylpyrrolidone may be 10 mg/ml, and the rotation speed of spin coating may be set between 1000 rpm and 3000 rpm, for example, 2000 rpm.

S252a, forming a photoresist layer 29b on the side of the sacrificial layer 29a away from the substrate 21. Optionally, in this step, the photoresist layer 29b may be formed by spin coating, wherein the photoresist layer 29b may be a negative photoresist, and the rotational speed of the spin coating may be set in a range of 3000 rpm to 5000 rpm, for example, 4000 rpm.

S253a, exposing and developing the photoresist layer 29b to remove the photoresist in the area corresponding to the accommodating groove. In this step, 365 nm ultraviolet (UV) light may be used for exposure at an exposure dose of 50 mj, and xylene is used to develop after exposure, wherein the development time may be set in the range of 60 s to 120 s, e.g., 90 s, followed by air drying.

S254a, etching the sacrificial layer 29a to form an accommodating groove for accommodating the light-emitting layer 23. In this step, the sacrificial layer 29a may be etched by dry etching. Specifically, oxygen plasma in an inductively coupled plasma (ICP) etching device may be used to etch the material of the sacrificial layer 29a, and the etching time is set between 10 s and 30 s, e.g. 20 s.

S255a, forming a light-emitting material layer 23a on a side of the first carrier transport layer 22 away from the substrate 21 and a side of the photoresist layer 29b away from the substrate 21. In this step, the light-emitting material layer 23a may be formed by spin coating. Specifically, an octane solution may be spin coated, wherein the octane solution comprises cadmium selenide/zinc sulfide (CdSe/ZnS) quantum dots, and the ligand of the cadmium selenide/zinc sulfide is octanethiol ligand. The concentration of the octane solution is 15 mg/ml, and the rotation speed of the spin coating may be set between 1500 rpm and 3500 rpm, for example, 2500 rpm.

S256a, removing the sacrificial layer 29a, thereby removing the light-emitting material outside the accommodating groove, leaving the light-emitting layer 23 located in the accommodating groove. In this step, the substrate 21 on which the light-emitting material layer 23a is formed may be placed in an ethanol solution, and ultrasonically treated with an energy at 240W. The duration time for ultrasonic treatment may be set in a range of 2 to 6 minutes, for example, 4 minutes, to remove the entire sacrificial layer cleanly. Annealing may then be carried out. The annealing temperature may be set at 60° C. to 180° C., for example, 120° C. The annealing time may be set at 10 minutes to 30 minutes, for example, 20 minutes.

S26, forming a second carrier transport layer 25, that is, a hole transport layer, on the side of the light-emitting layer 23 away from the substrate 21. The material of the hole transport layer may comprise poly(9,9-dioctylfluorene-co-N-(4-butylphenyl)diphenylamine) (TFB), or polyvinylcarbazole (PVK). In this step, the hole transport material may be formed on the light-emitting layer 23 by spin coating or evaporation, and then the hole transport material is cured to obtain a hole transport layer.

S27, forming a hole injection layer 27 on the side of the second carrier transport layer 25 away from the substrate 21. The material of the hole injection layer 27 may comprise poly(3,4-ethylenedioxythiophene)-polystyrene sulfonic acid (PEDOT/PSS). In this step, the hole injection material is formed on the second carrier transport layer 25 firstly by a process such as spin coating or evaporation, and then the hole injection material is cured to obtain the hole injection layer 27.

S28, forming a second electrode 26 on the side of the hole injection layer 27 away from the substrate 21. The second electrode 26 may be an anode. In this step, the second electrode 26 may be formed on the side of the hole injection layer 27 away from the substrate 21 by means of evaporation or sputtering. The material of the second electrode 26 may comprise metals such as aluminum, copper, or silver, and may also comprise indium tin oxide film or indium zinc oxide, etc.

In other specific embodiments, the inorganic ligands 222b comprise oxygen elements and metallic elements. Specifically, the inorganic ligands 222b are obtained by oxidizing the initial inorganic ligands including a non-oxygen element of the oxygen group elements and a metallic element. Exemplarily, the initial inorganic ligand is $Sn_2S_3^{2-}$, and the inorganic ligand 222b is $Sn_2O_3^{2-}$. In this case, the process of fabricating the light-emitting device also comprises steps S21 to S28 shown in FIG. 6. For steps S21 to S23, and steps S26 to S28, reference may be made to the description above. The step S24 (i.e., the step of forming the first carrier transport layer) may specifically comprise: firstly spin-coating an ethanol solution containing zinc oxide nanoparticles to form a zinc oxide nano film. The concentration of zinc oxide nanoparticles in the ethanol solution is 30 mg/ml, and the ligand is ethanolamine. The spin coating speed is set between 2000 rpm and 4000 rpm, e.g. 3000 rpm. Afterwards, the N-methylpyrrolidone solution of $Na_2Sn_2S_3$ is dropwise added onto the zinc oxide film. The concentration of the N-methylpyrrolidone solution of $Na_2Sn_2S_3$ is 5 mg/ml to 20 mg/ml, e.g., 10 mg/ml. The resultant is allowed to stand for 30 s for ligand exchange. Afterwards, spin-coating is performed to obtain the initial carrier transport layer, and the spin-coating speed may be set between 1000 rpm and 3000 rpm, for example, 2000 rpm. Finally, the first carrier transport layer 22 is obtained upon annealing. The annealing temperature may be set at 60° C. to 180° C., e.g., 120° C., and the annealing time may be set at 5 minutes to 15 minutes, e.g., 10 minutes. By adjusting the ligand exchange time or other process conditions, the first carrier transport layer as a whole can serve as the first transport sublayer; or the first carrier transport layer may comprise a first transport sublayer and a second transport sublayer.

Step S25 may specifically comprise the following steps S251b to S256b:

S251b, forming a sacrificial layer 29a on the side of the first carrier transport layer away from the substrate 21. Specifically, the ethanol solution of polyvinylpyrrolidone is spin-coated on the first carrier transport layer 22 to obtain the sacrificial layer 29a. The concentration of polyvinylpyrrolidone may be 10 mg/ml, and the rotational speed of the spin coating may be set between 1000 rpm and 3000 rpm, for example, 2000 rpm.

S252b, forming a photoresist layer 29b on the side of the sacrificial layer 29a away from the substrate 21. Optionally, in this step, the photoresist layer 29b may be formed by spin coating. The photoresist layer 29b may be a negative photoresist, and the rotational speed of the spin coating may be set at 3000 rpm to 5000 rpm, for example, 4000 rpm.

S253b, exposing and developing the photoresist layer 29b to remove the photoresist in the area corresponding to the accommodating groove. In this step, 365 nm ultraviolet (UV) light may be used for exposure at an exposure dose of 50 mj, and xylene is used to develop after exposure, wherein the time duration for development may be set at 60 s to 120 s, for example, 90 s, followed by air drying.

S254b, etching the sacrificial layer 29a to form an accommodation groove for accommodating the light-emitting layer 23, and oxidizing the initial inorganic ligand to obtain the inorganic ligand 222b. That is, $Sn_2S_3^{2-}$ is oxidized to $Sn_2O_3^{2-}$. In this step, the sacrificial layer 29a may be etched by a dry etching method, specifically, the material of the sacrificial layer 29a may be etched by using oxygen plasma in an inductively coupled plasma etching equipment, and the etching time is set between 20 s and 40 s, for example 30 s.

S255b, forming a light-emitting material layer 23a on a side of the first carrier transport layer 22 away from the substrate 21 and a side of the photoresist layer 29b away from the substrate 21. The specific process of this step S255b may be the same as that of the above-mentioned step S255a, which will not be repeated here.

S256b, removing the sacrificial layer 29a, thereby removing the light-emitting material outside the accommodating groove, leaving the light-emitting material layer 23 in the accommodating groove. The specific process of this step S256b may be the same as that of the above-mentioned step S256a, which will not be repeated here.

In some other specific embodiments, the inorganic ligand 222b comprises oxygen element and a metallic element. Specifically, the inorganic ligand 222b is obtained by oxidizing the initial inorganic ligand comprising oxygen element of the oxygen group elements and a metallic element. The oxygen element in the initial inorganic ligand is in an unsaturated state. Illustratively, the initial inorganic ligand is $MoO_3^-$, and the inorganic ligand 222b is $MoO_4^-$. In this case, the process of fabricating the light-emitting device also comprises steps S21 to S28 shown in FIG. 6. For steps S21 to S23, and steps S26 to S28, reference may be made to the description above. Step S24 (i.e., the step of forming the first carrier transport layer) may specifically comprise: spin-coating an ethanol solution containing zinc oxide nanoparticles to form a zinc oxide nanoparticle film. The concentration of zinc oxide nanoparticles in the ethanol solution is 30 mg/ml, and the ligand is ethanolamine. The spin coating speed is set between 2000 rpm and 4000 rpm, e.g. 3000 rpm. Afterwards, the N-methylpyrrolidone solution of $NaMoO_3$ is dropwise added onto the zinc oxide nanoparticle film. The concentration of the N-methylpyrrolidone solution of $NaMoO_3$ is 5 mg/ml to 20 mg/ml, for example, 10 mg/ml. The resultant is allowed to stand for 30 s for ligand exchange. Afterwards, spin-coating is performed to obtain the initial carrier transport layer. The spin-coating speed may be set between 1000 rpm and 3000 rpm, for example, 2000 rpm. Finally, the first carrier transport layer 22 is obtained upon annealing. The annealing temperature may be set at 60° C. to 180° C., e.g., 120° C., and the annealing time may be set at 5 minutes to 15 minutes, e.g., 10 minutes. By adjusting the ligand exchange time or other process conditions, the first carrier transport layer as a whole can serve as the first transport sublayer; or the first carrier transport layer comprises a first transport sublayer and a second transport sublayer.

Step S25 may specifically comprise the following steps S251c to S256c: S251c, forming a sacrificial layer 29a on the side of the first carrier transport layer 22 away from the substrate 21. Specifically, an ethanol solution of polyvinylpyrrolidone may be spin-coated on the first carrier transport layer 22 to obtain the sacrificial layer 29a. The concentration of polyvinylpyrrolidone may be mg/ml, and the rotational speed of the spin coating may be set between 1000 rpm and 3000 rpm, for example, 2000 rpm.

S252c, forming a photoresist layer 29b on the side of the sacrificial layer 29a away from the substrate 21. Optionally, in this step, the photoresist layer 29b may be formed by spin coating. The photoresist layer 29b may adopt a negative photoresist, and the rotational speed of the spin coating may be set at 3000 rpm to 5000 rpm, for example, 4000 rpm.

S253c, exposing and developing the photoresist layer 29b to remove the photoresist in the area corresponding to the accommodating groove. In this step, 365 nm ultraviolet (UV) light may be used for exposure at an exposure dose of 50 mj, and xylene is used to develop after exposure, wherein the development time may be set at 60 to 120 s, e.g., 90 s, followed by air drying.

S254c, etching the sacrificial layer 29a to form an accommodation groove for accommodating the light-emitting layer 23, and oxidizing the initial inorganic ligand to obtain the inorganic ligand 222b. That is, $MoO_3^-$ is oxidized to $MoO_4^-$. In this step, the sacrificial layer 29a may be etched by a dry etching method. Specifically, the material of the sacrificial layer 29a may be etched by using oxygen plasma in an inductively coupled plasma etching equipment, and the etching time is set between 40 s and 60 s, for example 50 s.

S255c, forming a light-emitting material layer 23a on the side of the first carrier transport layer 22 away from the substrate 21 and on the side of the photoresist layer 29b away from the substrate 21. The specific process of this step S255c may be the same as the above-mentioned step S255a, which will not be repeated here.

S256c, removing the sacrificial layer 29a, so as to remove the light-emitting material outside the accommodating groove, leaving the light-emitting layer 23 located in the accommodating groove. The specific process of this step S256c may be the same as that of the above-mentioned step S256a, which will not be repeated here.

Figure 8:
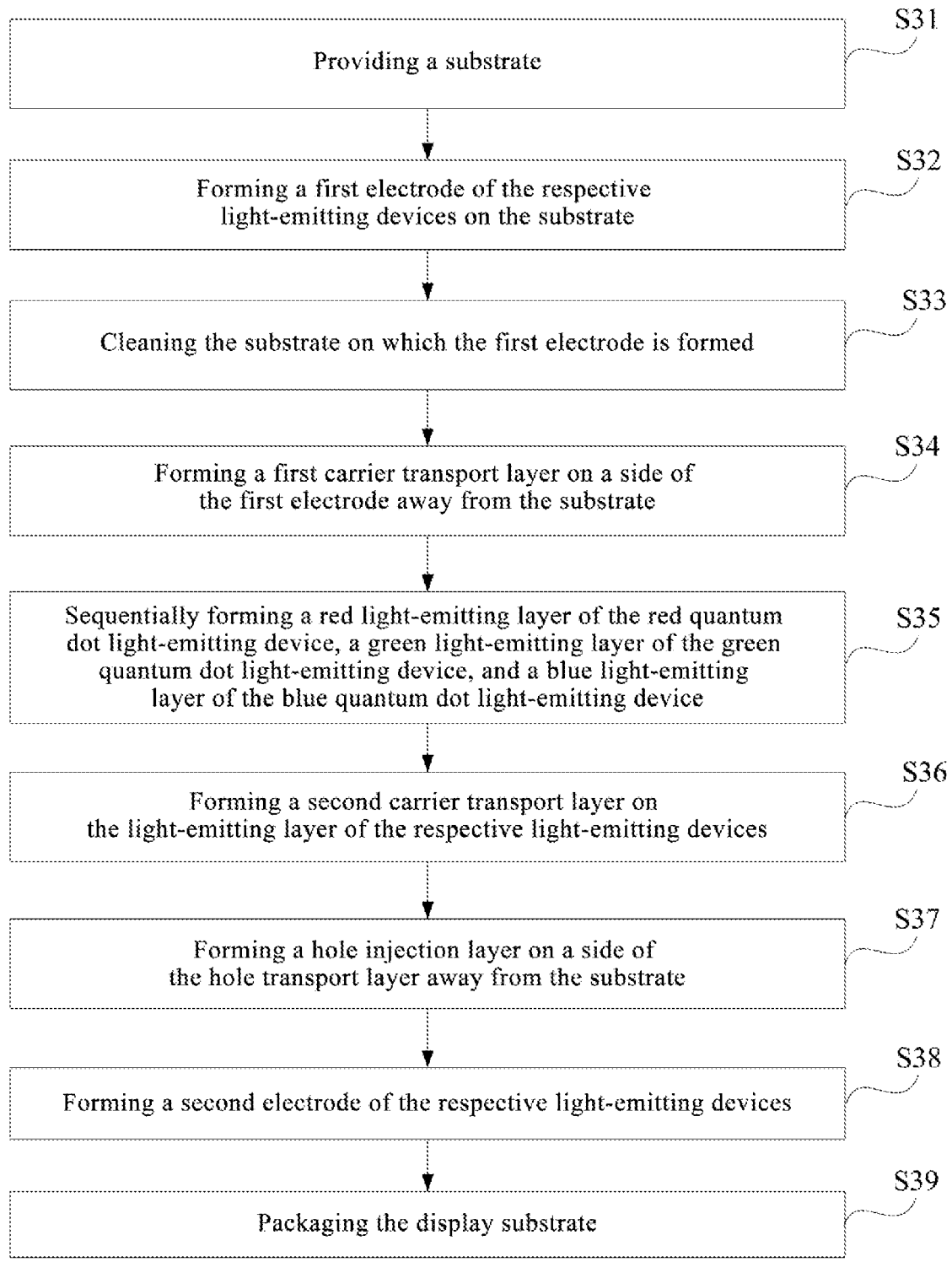
FIG. 8 is a flow chart of a method for fabricating a display substrate according to an embodiment of the present disclosure.
Figure 9A:
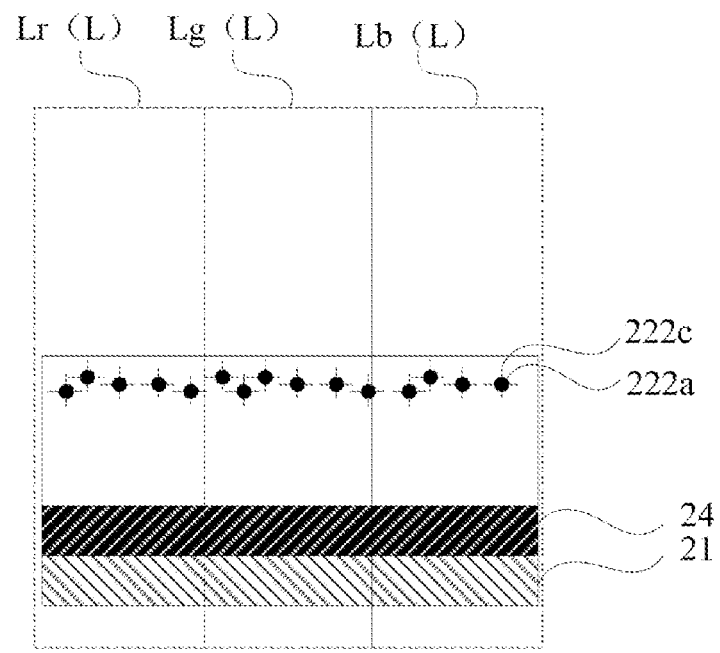
FIGS. 9a to 9f are schematic diagrams of a manufacturing process of a display substrate according to an embodiment of the present disclosure.
Figure 9B:
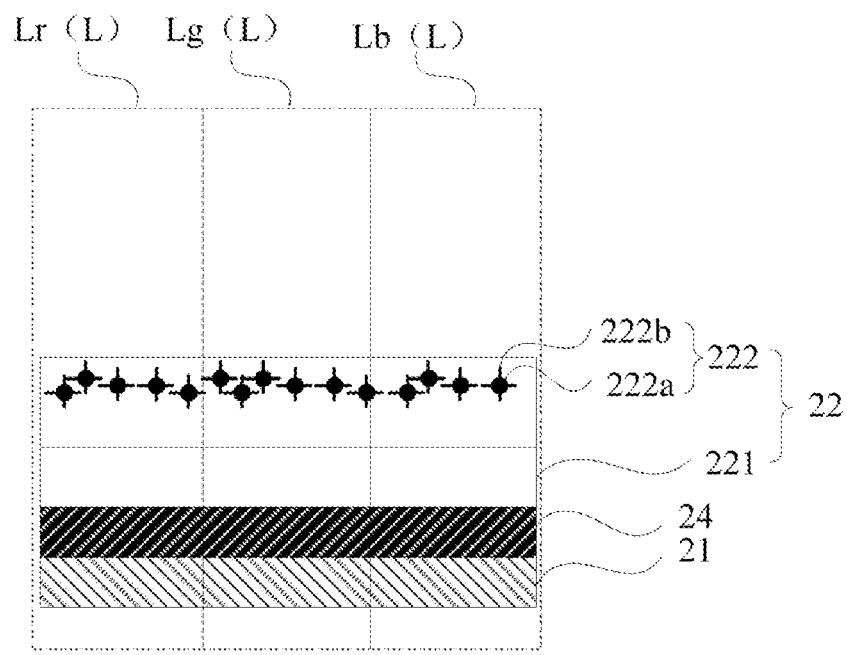
Figure 9C:
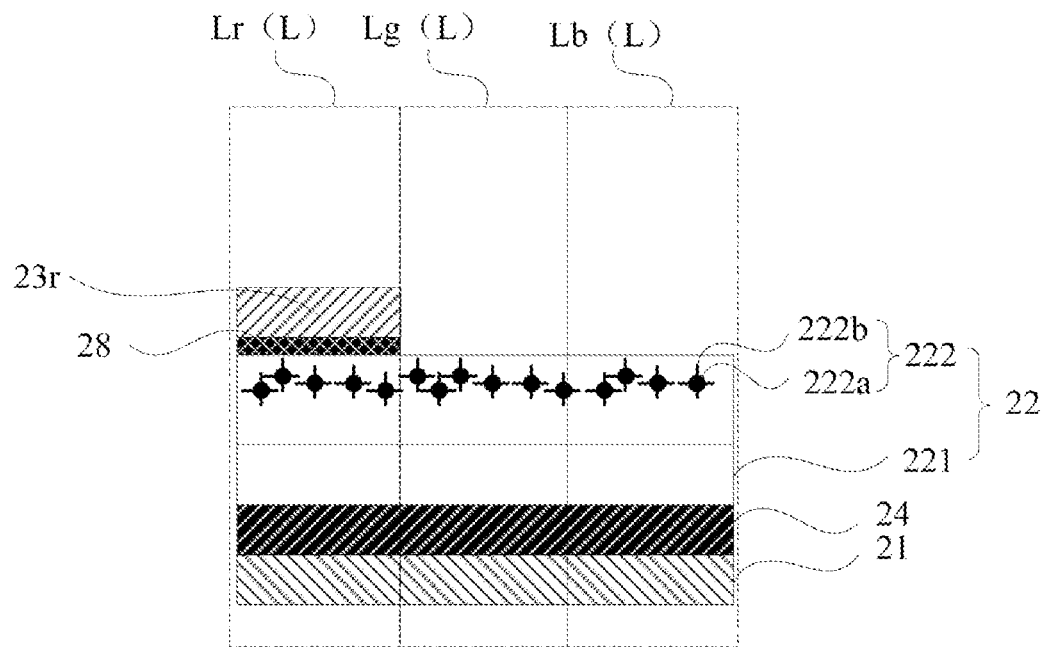
Figure 9D:
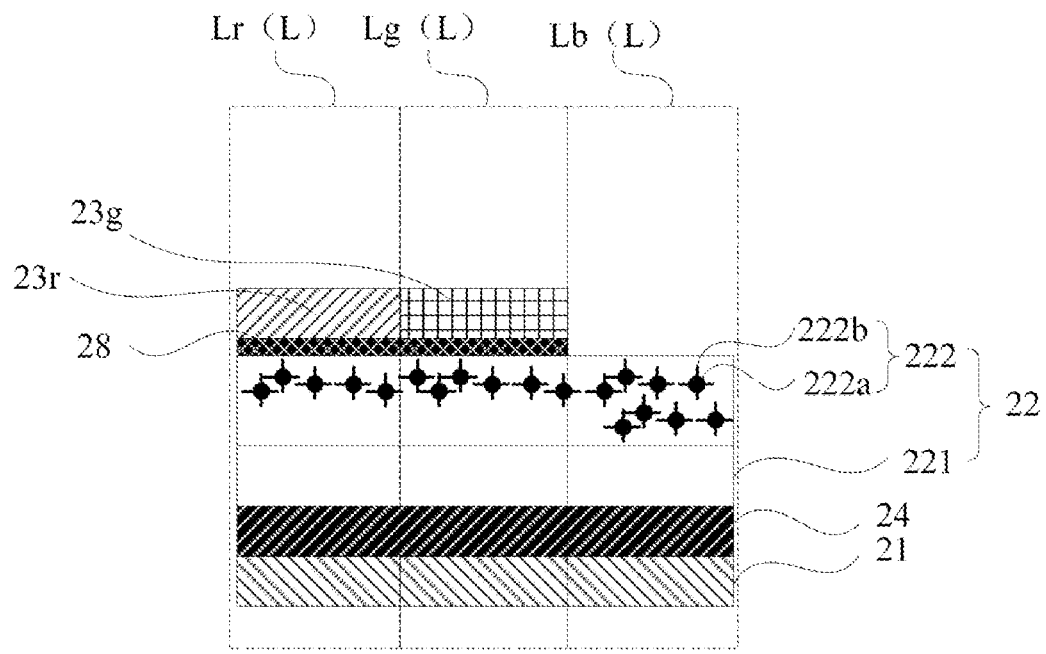
Figure 9E:
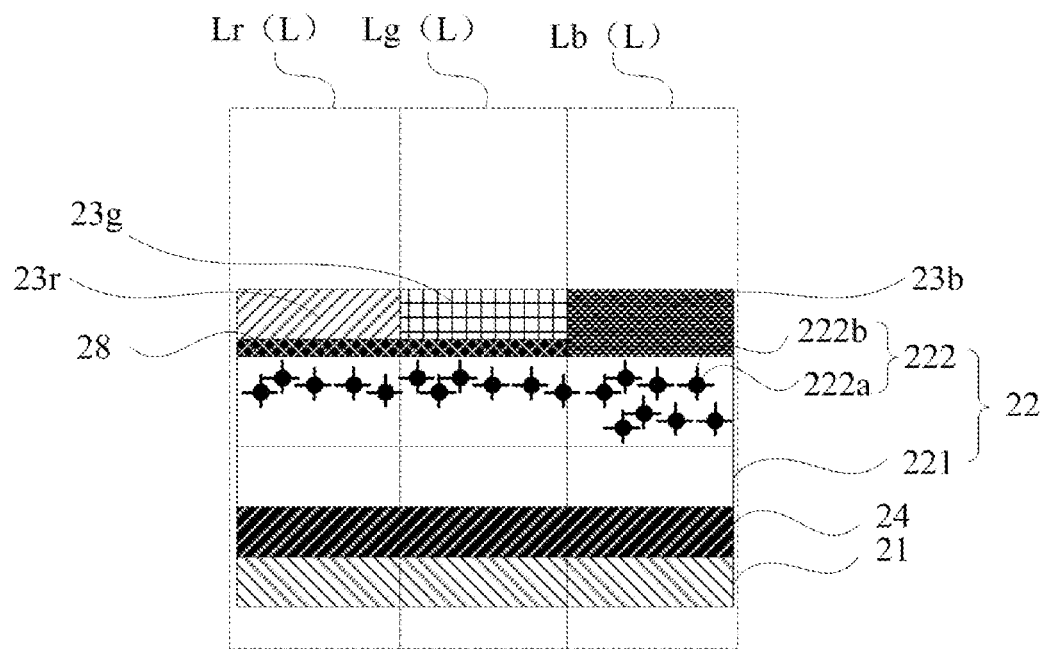
Figure 9F:
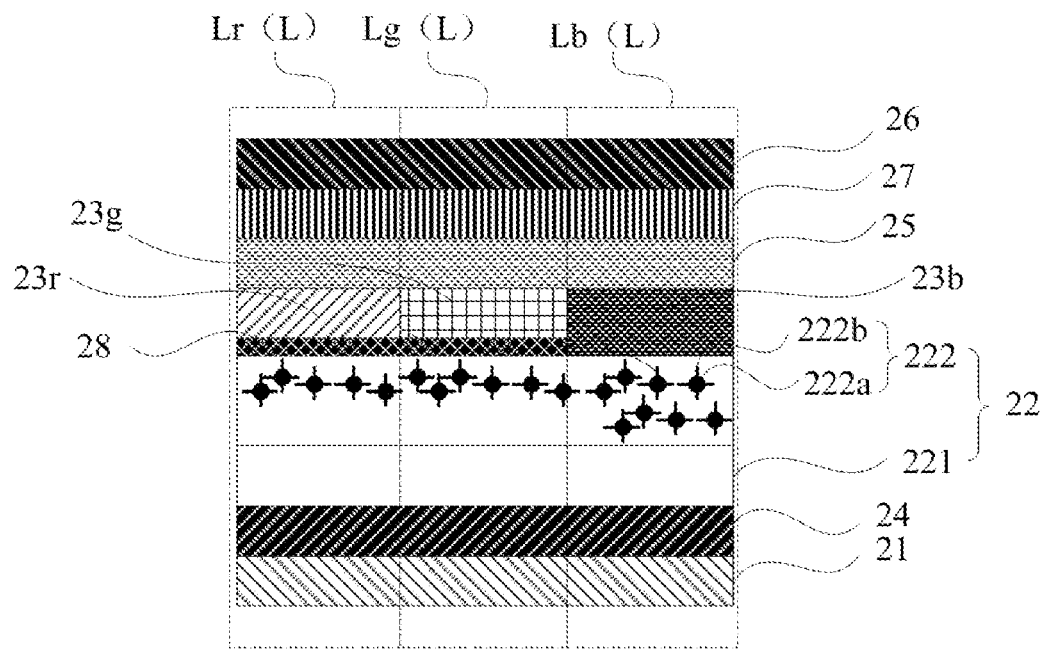

An embodiment of the present disclosure further provides a method for manufacturing a display substrate. In an embodiment of the present disclosure, the display substrate comprises: a plurality of light-emitting devices L comprising a plurality of first light-emitting devices and a plurality of second light-emitting devices. Exemplarily, each of the plurality of first light-emitting devices is a blue quantum dot light-emitting device Lb, and a portion of the plurality of second light-emitting devices are red quantum dot light-emitting devices Lr, while the other portion are green quantum dot light-emitting devices Lg. Each of the plurality of light-emitting devices L adopts the light-emitting devices L in the above-mentioned embodiments. In the following, the preparation method of the display substrate according to the embodiment of the present disclosure is described by taking the light-emitting device L of an inverted structure and the inorganic ligand 222b of $CdCl_4^-$ as an example. FIG. 8 is a flow chart of a method for manufacturing a display substrate provided by an embodiment of the present disclosure, and FIGS. 9a to 9f are schematic diagrams of a manufacturing process of a display substrate provided by an embodiment of the present disclosure. As shown in FIG. 8 and FIGS. 9a to 9f, the preparation method of the display substrate provided by the embodiment of the present disclosure comprises the following steps:

S31, providing a substrate 21.

S32, forming a first electrode 24 of the respective light-emitting device L on the substrate 21. The first electrode 24 may be a cathode, and the first electrodes 24 of the plurality of light-emitting devices L may be connected into an integrated structure. The material of the first electrode 24 may comprise metal, and the light-emitting device L may be a bottom emission structure or a top emission structure, which is specifically determined according to actual needs, and is not limited herein. For example, when the light-emitting device L has a bottom emission structure, the first electrode 24 may be made of a transparent metal material, such as indium tin oxide; or when the light-emitting device L has a top emission structure, the first electrode 24 may be made of a non-transparent metal material, such as copper. In this step, the first electrode 24 may be formed by a process such as evaporation or sputtering.

S33, cleaning the substrate 21 on which the first electrode 24 is formed. In this step, isopropanol, water, and acetone solution may be used to perform ultrasonic cleaning of the substrate 21 on which the first electrode 24 is formed, respectively. Further, the substrate 21 on which the first electrode 24 is formed may also be illuminated by ultraviolet (UV) light, and the duration time of illumination may be set at 5 to 10 minutes.

S34, forming the first carrier transport layer 22 on the side of the first electrode 24 away from the substrate 21. The first carrier transport layer 22 is an electron transport layer. For the formation process of the first carrier transport layer 22, reference may be made to the above description, which is not repeated here.

S35, sequentially forming a red light-emitting layer of the red quantum dot light-emitting device, a green light-emitting layer of the green quantum dot light-emitting device, and a blue light-emitting layer of the blue quantum dot light-emitting device.

The process of forming the red light-emitting layer 23r comprises the following steps S351a to S355a:

S351a, forming a sacrificial layer on the side of the first carrier transport layer 22 away from the substrate 21. Specifically, an ethanol solution of polyvinylpyrrolidone may be spin-coated on the first carrier transport layer 22. The concentration of polyvinylpyrrolidone may be 10 mg/ml, and the rotation speed of spin coating may be set between 1000 rpm and 3000 rpm, for example, 2000 rpm.

S352a, forming an accommodating groove corresponding to the red quantum dot light-emitting device Lr on the sacrificial layer. The accommodating groove may be formed on the sacrificial layer by dry etching. For example, oxygen plasma in an inductively coupled plasma etching device may be used to etch the sacrificial layer material, with the etching time being set between 10 s and 30 s, for example, 20 s.

S353a, forming a carrier blocking layer 28 in the accommodating groove corresponding to the red quantum dot light-emitting device Lr, which may be an electron blocking layer in particular. In this step, a solution of a methacrylic acid in ethanol at a concentration of 1 mg/ml to 3 mg/ml, e.g., 2 mg/ml, may be spin-coated on the first carrier transport layer 22; then exposure is performed, with the exposure dose being set to 50 mj; and then development is performed using ethanol. After development, the carrier blocking layer 28 is obtained by annealing. The temperature during annealing can be set at 60° C. to 180° C., e.g., 120° C.; and the annealing time can be set at 60 s to 120 s, e.g., 90 s.

S354a, forming a red light-emitting material layer. In this step, an octane solution containing red quantum dots may be spin-coated on the carrier blocking layer 28 and the sacrificial layer. The red quantum dot material comprises cadmium selenide/zinc sulfide, and the ligand is an octanethiol ligand. The concentration of the octane solution is 15 mg/ml, and the rotation speed of the spin coating may be set between 1500 rpm and 3500 rpm, for example, 2500 rpm.

S355a, removing the sacrificial layer, so that the red light-emitting material layer in the accommodating groove of the red quantum dot light-emitting device Lr is left, and the red light-emitting material layer in other areas is removed, thereby obtaining the red light-emitting layer 23r. In this step, the substrate on which the red light-emitting material layer is formed may be placed in an ethanol solution and subjected to ultrasonic treatment. The energy of the ultrasonic treatment is about 240 W, and the treatment time may be set between 2 minutes and 6 minutes, for example, 4 minutes. Then, annealing is performed to obtain a display substrate including the red light-emitting layer 23r. The annealing temperature may be set at 60° C. to 180° C., for example, 120° C.; and the annealing time may be set at 10 min to 30 min, for example, 20 min.

After the red light-emitting layer is formed, step S261 is performed to form the green light-emitting layer 23g. The preparation process of the green light-emitting layer 23g is the same as that in steps S351a to S355a, so it is not repeated here.

Afterwards, the blue light-emitting layer 23b is formed. Specifically, the step of forming the blue light-emitting layer 23b may comprise:

S351b, performing a second ligand exchange on the first carrier transport layer 22 in the region where the blue quantum dot light-emitting device Lb is located. In this step, a solution of $[Ph_2I]_2[CdCl_4]$ in N,N-dimethylformamide is formed on the first carrier transport layer 22 corresponding to the blue quantum dot light-emitting device Lb, wherein the concentration of the $[Ph_2I]_2[CdCl_4]$ in N,N-dimethylformamide solution may be set at 50 mg/ml to 150 mg/ml, e.g. 100 mg/ml. The resultant is allowed to stand for 300 s for ligand exchange, followed by spin coating and annealing. The rotation speed of spin coating may be set between 1000 rpm and 3000 rpm, for example, 2000 rpm. The annealing temperature may be set at 60° C. to 180° C., e.g., 120° C., and the annealing time may be set at 5 minutes to 15 minutes, e.g., 10 minutes.

S352b, forming a sacrificial layer on the side of the first carrier transport layer 22 away from the substrate 21. For details, refer to the description of step S351a, which will not be repeated here.

S353b, forming an accommodation groove corresponding to the blue quantum dot light-emitting device Lb on the sacrificial layer. For the specific manner of forming the accommodating groove, refer to the description of the foregoing step S352a, which will not be repeated here.

S354b, forming a blue light-emitting material layer. In this step, an octane solution including blue quantum dots may be spin-coated on the first carrier transport layer 22 and the sacrificial layer, thereby obtaining a blue light-emitting material layer. The blue quantum dot material may be cadmium selenide/zinc sulfide (CdSe/ZnS), and the ligand is octanethiol ligand. The octane solution has a concentration of 15 mg/ml, and the spin coating speed may be set between 1500 rpm and 3500 rpm, for example, 2500 rpm.

S355b, removing the sacrificial layer, so that the blue light-emitting material layer in the accommodating groove of the blue quantum dot light-emitting device Lb is left, and the blue light-emitting material layer in other areas is removed, thereby obtaining the blue light-emitting layer 23b. For the step of removing the sacrificial layer, refer to the description of the above step S355a, which is not repeated here.

S36, forming a second carrier transport layer 25, i.e., a hole transport layer, on the light-emitting layer of the respective light-emitting devices L. The material of the hole transport layer may comprise poly(9,9-dioctylfluorene-co-N-(4-butylphenyl)diphenylamine) (TFB), or polyvinylcarbazole (PVK). In this step, the hole transport layer is formed by a process such as spin coating or evaporation.

S37, forming a hole injection layer 27 on the side of the hole transport layer away from the substrate 21. The material of the hole injection layer 27 may comprise poly(3,4-ethylenedioxythiophene)-polystyrene sulfonic acid (PEDOT/PSS). In this step, the hole injection layer 27 is formed by a process such as spin coating or evaporation.

S38, forming the second electrode 26 of the respective light-emitting devices L. The second electrode 26 may be an anode, and the second electrodes 26 of the different light-emitting devices L may be arranged at intervals. In this step, the second electrode 26 may be formed on the side of the second carrier transport layer 25 away from the substrate 21 by means of evaporation or sputtering. The material of the second electrode 26 layer may comprise metals such as aluminum, copper, or silver, or may comprise indium tin oxide film or indium zinc oxide and so on.

S39, packaging the display substrate. For example, the display substrate is encapsulated using a package cover plate.

It should be understood that the above embodiments are merely exemplary embodiments adopted to illustrate the principles of the present disclosure, but the present disclosure is not limited thereto. For those skilled in the art, various modifications and improvements can be made without departing from the spirit and essence of the present disclosure, and these modifications and improvements are also regarded as the protection scope of the present disclosure.

What is claimed is:

1. A display substrate, comprising a plurality of light-emitting devices, wherein each of the plurality of light-emitting devices comprises:
   a first carrier transport layer disposed on a substrate; and
   a light-emitting layer disposed on a side of the first carrier transport layer away from the substrate;
   wherein the first carrier transport layer comprises a first transport sublayer, the first transport sublayer comprises nanoparticles and an inorganic ligand connected to a surface of the nanoparticles, and the inorganic ligand comprises a halogen group element or an oxygen group element;
   wherein the plurality of light-emitting devices comprise a plurality of first light-emitting devices and a plurality of second light-emitting devices, and wherein a emission color of each of the plurality of first light-emitting devices is different from that of each of the plurality of the second light-emitting devices.

2. The display substrate according to claim 1, wherein, when the first carrier transport layer is an electron transport layer, each of the plurality of the second light-emitting devices further comprises an electron blocking layer located between the electron transport layer and the light-emitting layer of the second light-emitting device; or
   when the first carrier transport layer is a hole transport layer, each of the plurality of the first light-emitting devices further comprises a hole blocking layer located between the hole transport layer and the light-emitting layer of the first light-emitting device.

3. The display substrate according to claim 1, wherein, when the first carrier transport layer is an electron transport layer, a thickness of the first carrier transport layer of each of the plurality of second light-emitting devices is greater than the thickness of the first carrier transport layer of each of the plurality of first light-emitting devices;
   when the first carrier transport layer is a hole transport layer, the thickness of the first carrier transport layer of each of the plurality of first light-emitting devices is greater than the thickness of the first carrier transport layer of each of the plurality of second light-emitting devices.

4. The display substrate according to claim 1, wherein,
when the first carrier transport layer is an electron transport layer, a doping concentration of the inorganic ligand in the first carrier transport layer of each of the plurality of second light-emitting devices is smaller than the doping concentration of the inorganic ligand in the first carrier transport layer of each of the plurality of first light-emitting devices;
when the first carrier transport layer is a hole transport layer, the doping concentration of the inorganic ligand in the hole transport layer of each of the plurality of second light-emitting devices is greater than the doping concentration of the inorganic ligand in the hole transport layer of each of the plurality of first light-emitting devices.

5. The display substrate according to claim 1, wherein each of the plurality of first light-emitting devices is a blue quantum dot light-emitting device, and the plurality of second light-emitting devices comprise a plurality of red quantum dot light-emitting devices and a plurality of green quantum dot light-emitting devices.

6. The display substrate according to claim 1, wherein a general formula of the inorganic ligand comprises: $B^-$ or $AB_x^{y-}$;
wherein, B is the halogen group element, A is a metallic element, and both x and y are positive integers.

7. The he display substrate according to claim 6, wherein B comprises any one of iodine, chlorine, bromine and fluorine, and A comprises any one of zinc, cadmium, mercury, copper, silver and gold.

8. The display substrate according to claim 1, wherein a general formula of the inorganic ligand comprises: $MJ_x^{y-}$ or $M_zJ_x^{y-}$;
wherein, J is the oxygen group element, M is a metallic element, and x, y, and z are all positive integers.

9. The display substrate according to claim 8, wherein J comprises any one of oxygen, sulfur, selenium, and tellurium, and M comprises any one of molybdenum, chromium, tungsten, iron, ruthenium, osmium, cobalt, rhodium, aluminum, gallium, indium, germanium, tin, lead, antimony, and bismuth.

10. The display substrate according to claim 1, wherein the first carrier transport layer further comprises a second transport sublayer located on a side of the first transport sublayer away from the light-emitting layer; and wherein the inorganic ligand is not contained in the second transport sublayer.

11. The display substrate according to claim 1, wherein the light-emitting device further comprises:
a first electrode disposed between the substrate and the first carrier transport layer;
a second carrier transport layer disposed on a side of the light-emitting layer away from the substrate; and
a second electrode disposed on a side of the second carrier transport layer away from the substrate;
wherein, one of the first carrier transport layer and the second carrier transport layer is an electron transport layer, and the other is a hole transport layer.

12. The display substrate according to claim 1, wherein the light-emitting layer comprises a quantum dot layer.

13. A preparation method of a light-emitting device, comprising:
forming a first carrier transport layer on a substrate; and
forming a light-emitting layer on a side of the first carrier transport layer away from the substrate;
wherein the first carrier transport layer comprises a first transport sublayer comprising nanoparticles and an inorganic ligand connected to the surface of the nanoparticles, and the inorganic ligand comprises a halogen group element or an oxygen group element,
wherein, before forming the light-emitting layer, the preparation method further comprises:
forming a sacrificial layer on a side of the first carrier transport layer away from the substrate; and
forming an accommodating groove on the sacrificial layer;
wherein the light-emitting layer is formed in the accommodating groove; and
after forming the light-emitting layer, the preparation method further comprises removing the sacrificial layer.

14. The preparation method according to claim 13, wherein the forming an accommodating groove on the sacrificial layer specifically comprises:
forming a photoresist layer on the sacrificial layer;
exposing and developing the photoresist layer to remove the photoresist in the area corresponding to the accommodating groove; and
etching the sacrificial layer by oxygen plasma to form the accommodating groove.

\* \* \* \* \*